United States Patent
Kang et al.

(10) Patent No.: US 11,934,701 B2
(45) Date of Patent: Mar. 19, 2024

(54) STORAGE CONTROLLER DETERMINING DISTRIBUTION TYPE, METHOD OF OPERATING THE SAME, AND METHOD OF OPERATING STORAGE DEVICE INCLUDING THE SAME

(71) Applicant: SAMSUNG ELECTRONICS CO., LTD., Suwon-si (KR)

(72) Inventors: Woohyun Kang, Hwaseong-si (KR); Youngdeok Seo, Seoul (KR); Hyuna Kim, Suwon-si (KR); Hyunkyo Oh, Yongin-si (KR); Donghoo Lim, Hwaseong-si (KR)

(73) Assignee: SAMSUNG ELECTRONICS CO., LTD., Suwon-si Gyeonggi-do (KR)

( * ) Notice: Subject to any disclaimer, the term of this patent is extended or adjusted under 35 U.S.C. 154(b) by 155 days.

(21) Appl. No.: 17/722,780

(22) Filed: Apr. 18, 2022

(65) Prior Publication Data
US 2023/0086157 A1 Mar. 23, 2023

(30) Foreign Application Priority Data
Sep. 17, 2021 (KR) .................. 10-2021-0124637

(51) Int. Cl.
*G06F 3/06* (2006.01)
*G11C 7/10* (2006.01)

(52) U.S. Cl.
CPC .......... *G06F 3/0659* (2013.01); *G06F 3/0604* (2013.01); *G06F 3/0679* (2013.01); *G11C 7/1051* (2013.01)

(58) Field of Classification Search
CPC .... G06F 3/0659; G06F 3/0604; G06F 3/0679; G11C 7/1051
USPC ........................................................ 365/198
See application file for complete search history.

(56) References Cited

U.S. PATENT DOCUMENTS

| | | | |
|---|---|---|---|
| 7,957,187 B2 | 6/2011 | Mokhlesi et al. |
| 8,422,307 B2 | 4/2013 | Yoo et al. |
| 8,576,621 B2 | 11/2013 | Kang |
| 9,036,412 B2 | 5/2015 | Choi et al. |
| 9,324,420 B2 | 4/2016 | Shin et al. |

(Continued)

FOREIGN PATENT DOCUMENTS

| | | | |
|---|---|---|---|
| KR | 10-2018-0110473 A | 10/2018 |
| KR | 20190043022 A | 4/2019 |

(Continued)

*Primary Examiner* — Ly D Pham
(74) *Attorney, Agent, or Firm* — Muir Patent Law, PLLC

(57) ABSTRACT

Disclosed is a method of operating a storage controller which communicates with a non-volatile memory device. The method includes outputting a first command including a request for on-chip valley search (OVS) count data of a memory region of the non-volatile memory device to the non-volatile memory device, wherein the OVS count data includes a first count value and a second count value of a first read voltage and a third count value and a fourth count value of a second read voltage, receiving the OVS count data from the non-volatile memory device, determining a distribution type of the memory region to be a predicted distribution type, from among a plurality of distribution types, based on the OVS count data, and determining a subsequent operation, based on the predicted distribution type.

20 Claims, 19 Drawing Sheets

(56) References Cited

U.S. PATENT DOCUMENTS

| | | |
|---|---|---|
| 10,340,947 B2 | 7/2019 | Oh et al. |
| 10,559,362 B2 | 2/2020 | Shin et al. |
| 10,573,389 B2 | 2/2020 | Kim et al. |
| 10,580,486 B2 | 3/2020 | Kim et al. |
| 10,606,710 B2 | 3/2020 | Kim |
| 10,937,508 B2 | 3/2021 | Kim et al. |
| 10,998,041 B1 | 5/2021 | Avraham et al. |
| 11,189,358 B2 | 11/2021 | Choi et al. |
| 11,430,523 B2 | 8/2022 | Hong et al. |
| 2014/0119124 A1 | 5/2014 | Kim et al. |
| 2016/0284417 A1 | 9/2016 | Atsumi |
| 2018/0124637 A1 | 5/2018 | Kim et al. |
| 2020/0142590 A1 | 5/2020 | Chew et al. |
| 2021/0065815 A1 | 3/2021 | Lee et al. |
| 2022/0005539 A1* | 1/2022 | Kim ................. G11C 29/18 |
| 2022/0130437 A1* | 4/2022 | Park ................. G11C 16/349 |
| 2022/0139484 A1* | 5/2022 | Kim ................. G11C 16/28 |
| | | 365/185.09 |
| 2022/0222138 A1* | 7/2022 | Park ................. G11C 16/0483 |
| 2022/0222139 A1* | 7/2022 | Shin ................. G06F 11/1012 |
| 2022/0276802 A1* | 9/2022 | Seo ................. G11C 16/08 |

FOREIGN PATENT DOCUMENTS

| | | |
|---|---|---|
| KR | 20190084779 A | 7/2019 |
| KR | 10-2019-0096653 A | 8/2019 |
| KR | 10-2020-0034123 A | 3/2020 |
| KR | 10-2020-0139044 A | 12/2020 |
| KR | 20210082875 A | 7/2021 |
| KR | 20210100265 A | 8/2021 |

\* cited by examiner

FIG. 4
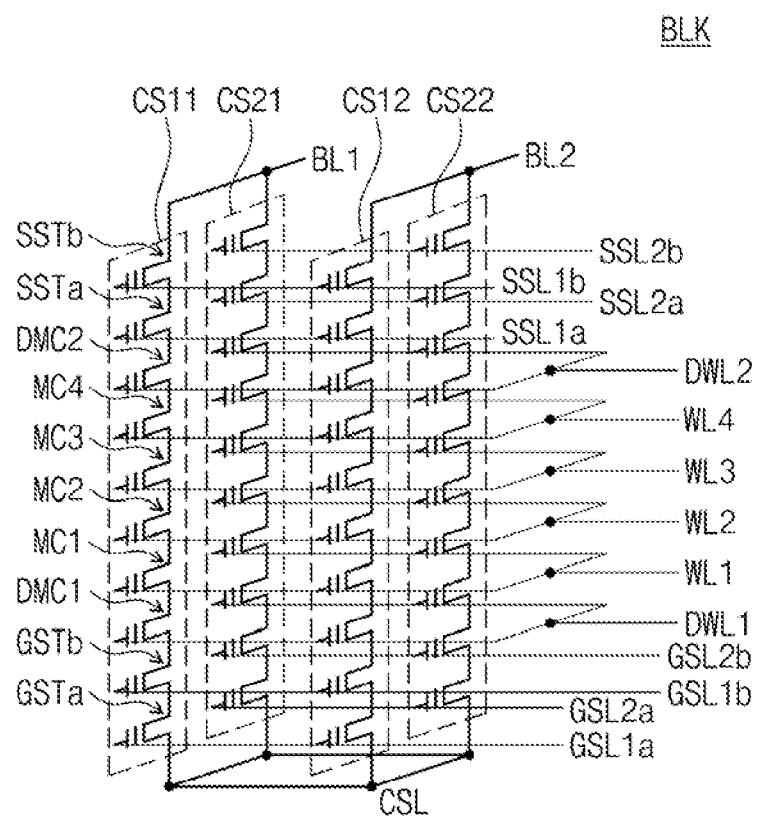
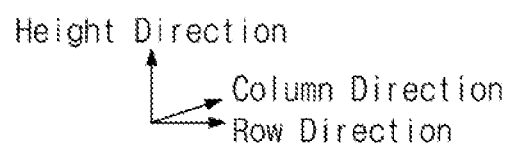

FIG. 8

<Distribution Type Table>

| Index | Type | Description |
|---|---|---|
| 1 | Normal | Memory cells are programmed normally |
| 2 | Retention | Threshold voltages are lowered as time elapsed |
| 3 | Read Disturb | According to a read operation of the adjacent word line, a threshold voltage distribution changes |
| 4 | Pre-programming | Among pre-programming and post-programming of QLC, only the pre-programming is performed |
| 5 | One-shot | One-shot programming is performed |
| 6 | HCI | A threshold voltage distribution is increased by a hot carrier injection |
| 7 | NCW | Threshold voltage distributions are generally low, because adjacent word lines are not programmed (No-coupled word line) |
| 8 | SPO | By Sudden power off, programming is abnormally performed |
| 9 | Erase | Memory cells are not yet programmed |

STORAGE CONTROLLER DETERMINING DISTRIBUTION TYPE, METHOD OF OPERATING THE SAME, AND METHOD OF OPERATING STORAGE DEVICE INCLUDING THE SAME

CROSS-REFERENCE TO RELATED APPLICATION

This application claims priority under 35 U.S.C. § 119 to Korean Patent Application No. 10-2021-0124637 filed on Sep. 17, 2021, in the Korean Intellectual Property Office, the disclosures of which are incorporated by reference herein in their entireties.

BACKGROUND

1. Field

Embodiments relate to a storage device, and more particularly, relate to a storage controller determining a threshold voltage distribution type of a non-volatile memory device, a method of operating the same, and a method of operating a storage device including the same.

2. Description of the Related Art

A memory device may store data in response to a write request and outputs data stored therein in response to a read request. The memory device may be classified as a volatile memory device, which loses data stored therein when a power supply is turned off (such as a dynamic random access memory (DRAM) device or a static RAM (SRAM) device), or a non-volatile memory device, which retains data stored therein even when a power supply is turned off (such as a flash memory device, a phase-change RAM (PRAM), a magnetic RAM (MRAM), or a resistive RAM (RRAM)).

SUMMARY

According to an embodiment, a method of operating a storage controller which communicates with a non-volatile memory device includes outputting a first command including a request for on-chip valley search (OVS) count data of a memory region of the non-volatile memory device to the non-volatile memory device, wherein the OVS count data includes a first count value and a second count value of a first read voltage and a third count value and a fourth count value of a second read voltage, receiving the OVS count data from the non-volatile memory device, determining a distribution type of the memory region to be a predicted distribution type, from among a plurality of distribution types, based on the OVS count data, and determining a subsequent operation, based on the predicted distribution type.

According to an embodiment, a method of operating a storage device which includes a non-volatile memory device and a storage controller includes providing, by the storage controller, a first command including an on-chip valley search (OVS) read request for a memory region of the non-volatile memory device to the non-volatile memory device, generating, by the non-volatile memory device, OVS count data of the memory region based on the first command, providing, by the storage controller, a second command including a request for the OVS count data to the non-volatile memory device, providing, by the non-volatile memory device, the OVS count data to the storage controller based on the second command, determining, by the storage controller, a distribution type of the memory region to be a predicted distribution type, from among a plurality of distribution types, based on the OVS count data, and determining, by the storage controller, a subsequent operation based on the predicted distribution type.

According to an embodiment, a storage controller includes an on-chip valley search (OVS) management module that generates an OVS read request for a memory region of a non-volatile memory device, a command generator that generates a first command including the OVS read request of the memory region and a second command including a request for OVS count data, under control of the OVS management module, a non-volatile memory interface circuit that provides the first and second commands to the non-volatile memory device and receives the OVS count data from the non-volatile memory device, and a type determiner configured to determine a distribution type of the memory region to be a predicted distribution type, from among a plurality of distribution types, based on the OVS count data.

BRIEF DESCRIPTION OF THE DRAWINGS

Features will become apparent to those of skill in the art by describing in detail example embodiments with reference to the attached drawings in which:

FIG. 4 is a diagram describing a memory block of a memory cell array of FIG. 3, according to some example embodiments.

FIG. 8 is a diagram describing a distribution type table according to some example embodiments.

DETAILED DESCRIPTION

Figure 1:
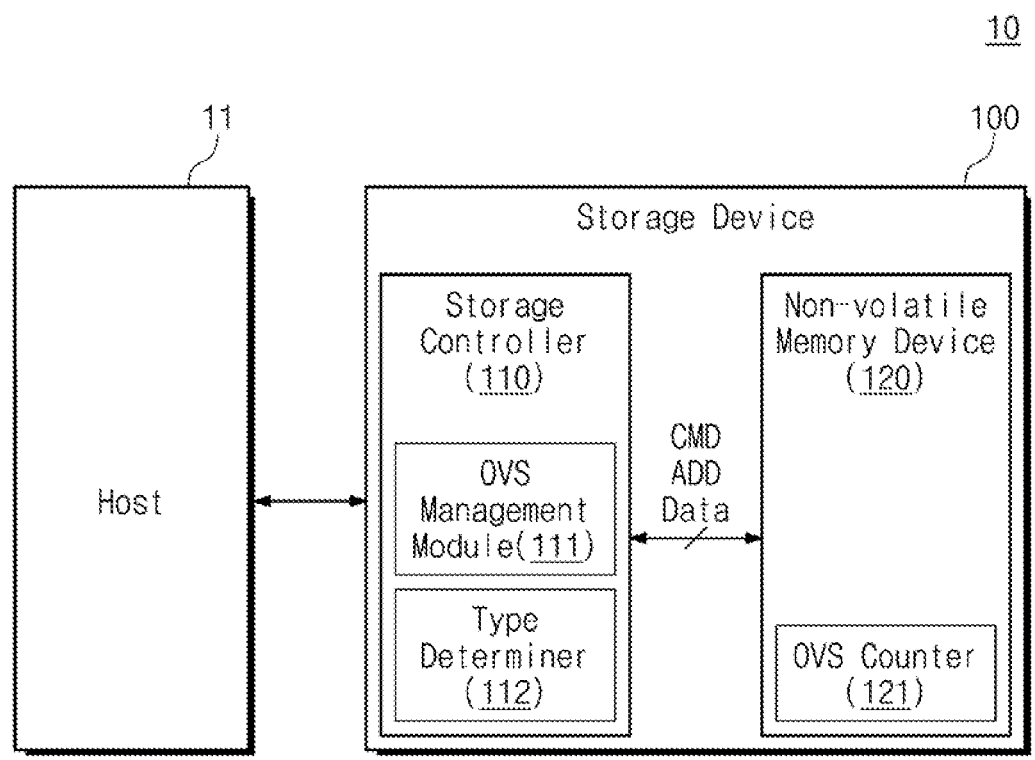
FIG. 1 is a block diagram of a storage system according to an example embodiment.

FIG. 1 is a block diagram of a storage system according to an example embodiment.

Referring to FIG. 1, a storage system 10 may include a host 11 and a storage device 100. The storage system 10 may be a computing system that is configured to process a variety of information, such as a personal computer (PC), a notebook, a laptop, a server, a workstation, a tablet PC, a smartphone, a digital camera, or a black box.

The host 11 may control an overall operation of the storage system 10. For example, the host 11 may store data in the storage device 100, or may read data stored in the storage device 100.

The storage device 100 may include a storage controller 110 and a non-volatile memory device 120. The non-volatile memory device 120 may store data. The storage controller 110 may store data in the non-volatile memory device 120 or may read data stored in the non-volatile memory device 120. The non-volatile memory device 120 may operate under control of the storage controller 110. For example, based on a command CMD indicating an operation and an address ADD indicating a location of data, the storage controller 110 may store the data in the non-volatile memory device 120, or may read the data stored in the non-volatile memory device 120.

The non-volatile memory device 120 may be a NAND flash memory device, but the non-volatile memory device 120 may be one of various storage devices, which retain data stored therein even though a power is turned off, such as a phase-change random access memory (PRAM), a magnetic random access memory (MRAM), a resistive random access memory (RRAM), and a ferroelectric random access memory (FRAM).

The storage controller 110 may include an on-chip valley search (OVS) management module 111 and a type determiner 112.

The OVS management module 111 may control an OVS read operation of a memory region by the non-volatile memory device 120. A memory region may correspond to a set of a plurality of memory cells, such as a memory channel, a memory chip, a memory plane, or a memory block in the non-volatile memory device 120.

The OVS read operation may be performed by the non-volatile memory device 120, not the storage controller 110.

The OVS read operation may refer to an operation of counting a number of memory cells included in a valley search section (e.g., a section including a voltage level section lower than an optimized read voltage and a voltage level section higher than the optimized read voltage) every read voltage, together with a normal read operation of reading data stored in the non-volatile memory device 120. The OVS read operation will be described in detail with reference to FIGS. 6 and 7 together.

The OVS management module 111 may control an OVS counter 121 of the non-volatile memory device 120. For example, the OVS management module 111 may provide an OVS read request to the non-volatile memory device 120, and the OVS counter 121 of the non-volatile memory device 120 may generate OVS count data corresponding to the OVS read operation. The non-volatile memory device 120 may provide the OVS count data to the storage controller 110 depending on a request of the storage controller 110.

The type determiner 112 may determine a distribution type of a memory region, based on the OVS count data received from the non-volatile memory device 120. For example, the type determiner 112 may request the OVS count data of the non-volatile memory device 120. The OVS count data may include a low area count value and a high area count value that are associated with each of a plurality of read voltages. The type determiner 112 may determine the distribution type of the memory region to be one distribution type, from among a plurality of distribution types, based on the OVS count data. This will be described in detail with reference to FIGS. 8, 9, 10, and 11 together.

The storage controller 110 may determine a subsequent operation to be performed in the non-volatile memory device 120, based on the distribution type determined by the type determiner 112. The determination of the subsequent operation may refer to the determination of an operation appropriate for the distribution type selected by the type determiner 112 regardless of whether the storage controller 110 issues a command to the non-volatile memory device 120.

For example, when the type determiner 112 determines the distribution type of the memory region to be a retention type (e.g., a type indicating that a threshold voltage distribution decreases over time), the storage controller 110 may change a read voltage level and may perform a read retry operation. The subsequent operation according to the determined type will be described in detail with reference to FIGS. 6, 15, and 16 together.

The type determiner 112 may determine the distribution type of the memory region by using a machine learning device. For example, the machine learning device may train for a relationship between the OVS count data and the distribution type. The machine learning device may determine the distribution type corresponding to the OVS count data, based on the trained relationship. The machine learning device will be described in detail with reference to FIGS. 12 and 13 together.

The non-volatile memory device 120 may include the OVS counter 121. The OVS counter 121 may generate the OVS count data corresponding to the OVS read operation under control of the OVS management module 111. For example, the OVS counter 121 may generate the OVS count data based on a command including the OVS read request.

As described above, according to an example embodiment, the non-volatile memory device 120 may generate the OVS count data by performing the OVS read operation. Because the non-volatile memory device 120 generates the OVS count data as a by-product of the normal read operation, the storage controller 110 may obtain distribution information (e.g., the OVS count data) without an additional read request or count operation. As such, an input/output (I/O) load and a latency of the storage device 100, which are associated with obtaining the distribution information, may decrease.

Also, according to an example embodiment, the storage controller 110 may determine the distribution type of the memory region based on the OVS count data. The storage controller 110 may determine a subsequent operation to be performed in the non-volatile memory device 120, based on the determined distribution type. Because the storage controller 110 determines the appropriate subsequent operation in consideration of the distribution type of the memory region, the reliability of the storage device 100 may be improved.

Figure 2:
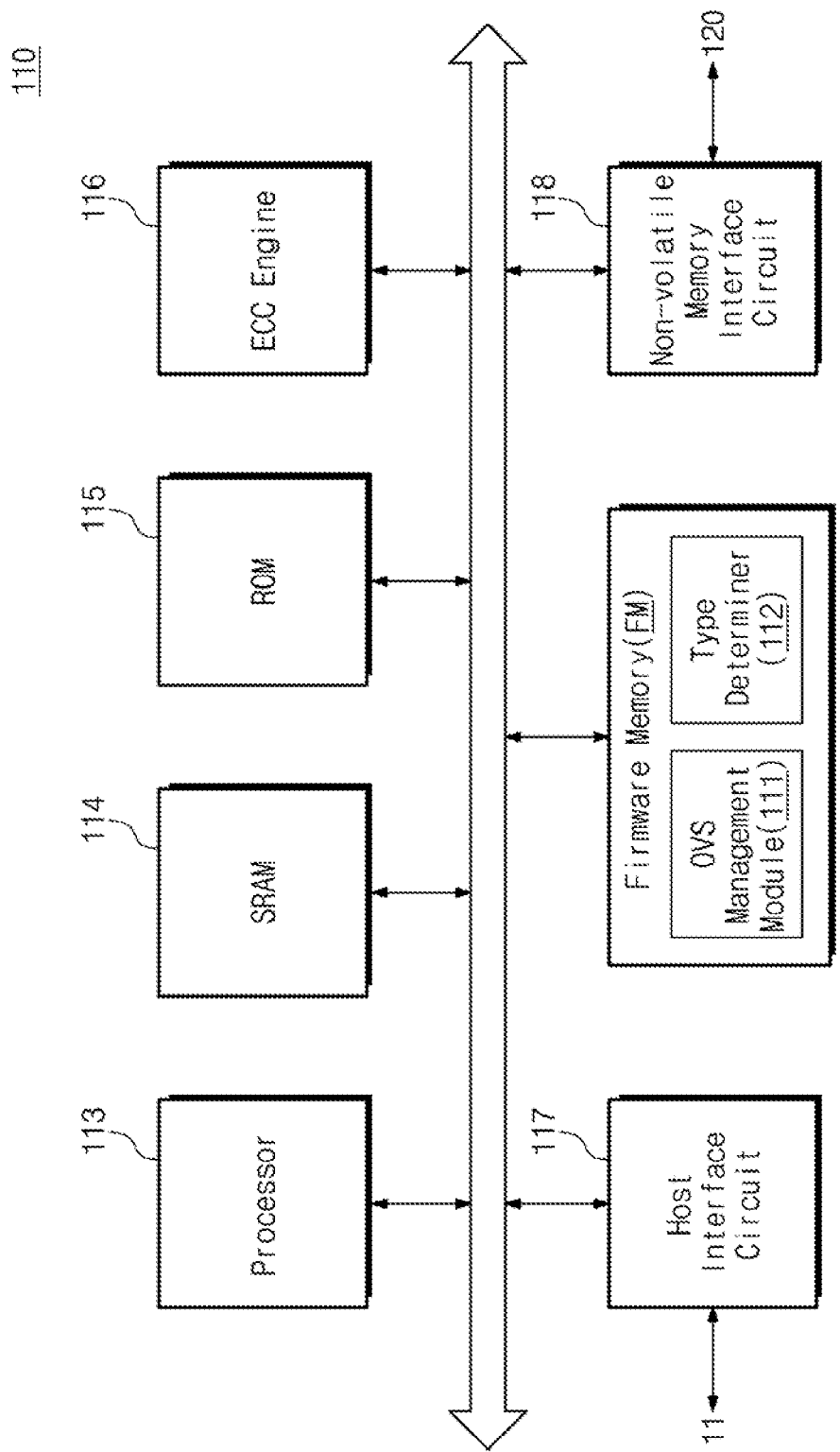
FIG. 2 is a block diagram illustrating a storage controller of FIG. 1 in detail, according to some example embodiments.

FIG. 2 is a block diagram illustrating a storage controller of FIG. 1 in detail, according to some example embodiments.

Referring to FIGS. 1 and 2, the storage controller 110 may communicate with the host 11 and the non-volatile memory device 120. The storage controller 110 may include the OVS management module 111, the type determiner 112, a processor 113, a static random access memory (SRAM) 114, a read only memory (ROM) 115, an error correcting code (ECC) engine 116, a host interface circuit 117, and a non-volatile memory interface circuit 118.

The OVS management module 111 and the type determiner 112 are similar to the OVS management module 111 and the type determiner 112 of FIG. 1, and thus, additional description will be omitted to avoid redundancy.

The storage controller 110 may include a firmware memory FM. The firmware memory FM may store a variety of information, which is used for the storage controller 110 to operate, in the form of instructions. For example, the OVS management module 111 and the type determiner 112 may be implemented by software, and the instructions stored in the firmware memory FM may execute or implement the OVS management module 111 and the type determiner 112. In another implementation, the OVS management module 111 and the type determiner 112 may be implemented with a separate hardware device.

The processor 113 may control an overall operation of the storage controller 110.

The SRAM 114 may be used as a buffer memory, a cache memory, or a working memory of the storage controller 110.

The ROM 115 may be used as a read only memory storing information used for the operation of the storage controller 110.

The ECC engine 116 may detect and correct an error of data read from the non-volatile memory device 120. For example, the ECC engine 116 may have an error correction capacity of a given level. The ECC engine 116 may process data having an error level exceeding the error correction capacity as an uncorrectable error.

The storage controller 110 may communicate with the host 11 through the host interface circuit 117. The host interface circuit 117 may be implemented based on at least one of various interfaces such as a serial ATA (SATA) interface, a peripheral component interconnect express (PCIe) interface, a serial attached SCSI (SAS), a nonvolatile memory express (NVMe) interface, and a universal flash storage (UFS) interface.

The storage controller 110 may communicate with the non-volatile memory device 120 through the non-volatile memory interface circuit 118. The non-volatile memory interface circuit 118 may be implemented based on a NAND interface.

The storage controller 110 may provide a command including the OVS read request to the non-volatile memory device 120 through the non-volatile memory interface circuit 118. The storage controller 110 may request the OVS count data from the non-volatile memory device 120 through the non-volatile memory interface circuit 118. The storage controller 110 may receive the OVS count data from the non-volatile memory device 120 through the non-volatile memory interface circuit 118.

Figure 3:
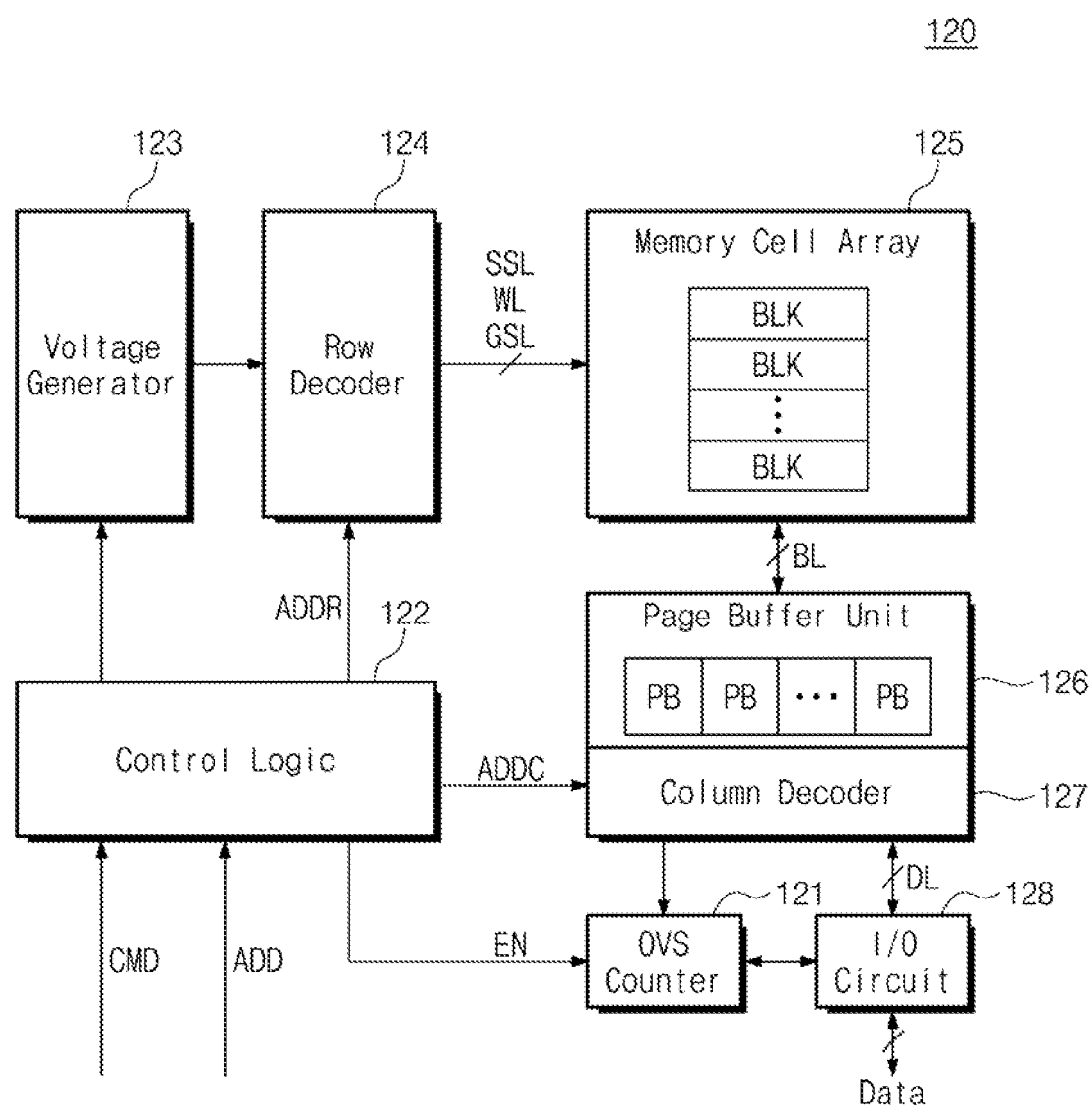
FIG. 3 is a block diagram illustrating a non-volatile memory device of FIG. 1 in detail, according to some example embodiments.

FIG. 3 is a block diagram illustrating a non-volatile memory device of FIG. 1 in detail, according to some example embodiments. FIG. 4 is a diagram describing a memory block of a memory cell array of FIG. 3, according to some example embodiments.

Referring to FIGS. 1, 3, and 4, the non-volatile memory device 120 may communicate with the storage controller 110. For example, the non-volatile memory device 120 may receive the address ADD and the command CMD from the storage controller 110. The non-volatile memory device 120 may exchange data with the storage controller 110.

The non-volatile memory device 120 may include the OVS counter 121, control logic 122, a voltage generator 123, a row decoder 124, a memory cell array 125, a page buffer unit 126, a column decoder 127, and an input/output (I/O) circuit 128.

The OVS counter 121 is similar to the OVS counter 121 of FIG. 1, and thus, additional description will be omitted to avoid redundancy.

The control logic 122 may receive the command CMD and the address ADD from the storage controller 110. The command CMD may refer to a signal directing an operation to be performed by the non-volatile memory device 120, such as a read operation, a write operation, or an erase operation. The address ADD may include a row address ADDR and a column address ADDC. The control logic 122 may control an overall operation of the non-volatile memory device 120 based on the command CMD and the address ADD. The control logic 122 may generate the row address ADDR and the column address ADDC based on the address ADD.

The control logic 122 may manage the command CMD including the OVS read request. For example, the command CMD may include the OVS read request. The control logic 122 may generate an enable signal EN based on the command CMD. The control logic 122 may allow the OVS counter 121 to generate the OVS count data, based on the enable signal EN.

The control logic 122 may manage the command CMD including a request for the OVS count data. For example, based on the command CMD including the request for the OVS count data, the control logic 122 may allow the OVS counter 121 to provide the OVS count data to the storage controller 110 through the I/O circuit 128.

Under control of the control logic 122, the voltage generator 123 may control voltages to be applied to the memory cell array 125 through the row decoder 124.

The row decoder 124 may receive the row address ADDR from the control logic 122. The row decoder 124 may be connected with the memory cell array 125 through string selection lines SSL, word lines WL, and ground selection lines GSL. The row decoder 124 may decode the row address ADDR and may control voltages to be applied to the string selection lines SSL, the word lines WL, and the ground selection lines GSL based on a decoding result and a voltage(s) received from the voltage generator 123.

The memory cell array 125 may include a plurality of memory blocks BLK. Each of the plurality of memory blocks BLK may be similar in structure to a memory block BLK illustrated in FIG. 4. The memory block BLK illustrated in FIG. 4 may correspond to a physical erase unit of the non-volatile memory device 120, but the physical erase unit may be changed to a page unit, a word line unit, a sub-block unit, or the like.

Referring to FIG. 4, the memory block BLK may include a plurality of cell strings CS11, CS12, CS21, and CS22. The plurality of cell strings CS11, CS12, CS21, and CS22 may be arranged in a row direction and a column direction. For brevity of drawing, 4 cell strings CS11, CS12, CS21, and CS22 are illustrated in FIG. 4, but the number of cell strings may increase or decrease in the row direction or the column direction.

Cell strings placed at the same column, from among the plurality of cell strings CS11, CS12, CS21, and CS22, may be connected with the same bit line. For example, the cell strings CS11 and CS21 may be connected with a first bit line BL1, and the cell strings CS12 and CS22 may be connected with a second bit line BL2. Each of the plurality of cell strings CS11, CS12, CS21, and CS22 may include a plurality of cell transistors. Each of the plurality of cell transistors may be implemented with a charge trap flash (CTF) memory cell. The plurality of cell transistors may be stacked in a height direction that is a direction perpendicular to a plane (e.g., a semiconductor substrate (not illustrated)) defined by the row direction and the column direction.

The plurality of cell transistors may be connected in series between a corresponding bit line (e.g., BL1 or BL2) and a common source line CSL. For example, the plurality of cell transistors may include string selection transistors SSTa and SSTb, dummy memory cells DMC1 and DMC2, memory cells MC1 to MC4, and ground selection transistors GSTa and GSTb. The serially-connected string selection transistors SSTa and SSTb may be provided between the serially-connected memory cells MC1 to MC4 and the corresponding bit line (e.g., BL1 or BL2). The serially-connected ground selection transistors GSTa and GSTb may be provided between the serially-connected memory cells MC1 to MC4 and the common source line CSL.

The second dummy memory cell DMC2 may be provided between the serially-connected string selection transistors SSTa and SSTb and the serially-connected memory cells MC1 to MC4, and the first dummy memory cell DMC1 may be provided between the serially-connected memory cells MC1 to MC4 and the serially-connected ground selection transistors GSTa and GSTb.

Memory cells placed at the same height, from among the memory cells MC1 to MC4 of the plurality of cell strings CS11, CS12, CS21, and CS22, may share the same word line. For example, the first memory cells MC1 of the plurality of cell strings CS11, CS12, CS21, and CS22 may be placed at the same height from the semiconductor substrate (not illustrated) and may share a first word line WL1. The second memory cells MC2 of the plurality of cell strings CS11, CS12, CS21, and CS22 may be placed at the same height from the semiconductor substrate (not illustrated) and may share a second word line WL2. Likewise, the third memory cells MC3 of the plurality of cell strings CS11, CS12, CS21, and CS22 may be placed at the same height from the semiconductor substrate (not illustrated) and may share a third word line WL3, and the fourth memory cells MC4 of the plurality of cell strings CS11, CS12, CS21, and CS22 may be placed at the same height from the semiconductor substrate (not illustrated) and may share a fourth word line WL4.

Dummy memory cells placed at the same height, from among the dummy memory cells DMC1 and DMC2 of the plurality of cell strings CS11, CS12, CS21, and CS22, may share the same dummy word line. For example, the first dummy memory cells DMC1 of the plurality of cell strings CS11, CS12, CS21, and CS22 may share a first dummy word line DWL1, and the second dummy memory cells DMC2 of the plurality of cell strings CS11, CS12, CS21, and CS22 may share a second dummy word line DWL2.

String selection transistors placed at the same height and the same row, from among the string selection transistors SSTa and SSTb of the plurality of cell strings CS11, CS12, CS21, and CS22, may share the same string selection line. For example, the string selection transistors SSTb of the cell strings CS11 and CS12 may share a string selection line SSL1b, and the string selection transistors SSTa of the cell strings CS11 and CS12 may share a string selection line SSL1a. The string selection transistors SSTb of the cell strings CS21 and CS22 may be connected with a string selection line SSL2b, and the string selection transistors SSTa of the cell strings CS21 and CS22 may be connected with a string selection line SSL2a.

Ground selection transistors placed at the same height and the same row, from among the ground selection transistors GSTa and GSTb of the plurality of cell strings CS11, CS12, CS21, and CS22, may be connected with the same ground selection line. For example, the ground selection transistors GSTb of the cell strings CS11 and CS12 may be connected with a ground selection line GSL1b, and the ground selection transistors GSTa of the cell strings CS11 and CS12 may be connected with a ground selection line GSL1a. The ground selection transistors GSTb of the cell strings CS21 and CS22 may be connected with a ground selection line GSL2b, and the ground selection transistors GSTa of the cell strings CS21 and CS22 may be connected with a ground selection line GSL2a.

The memory block BLK illustrated in FIG. 4 is merely an example, and the number of cell strings may increase or decrease, and the number of rows of cell strings and the number of columns of cell strings may increase or decrease depending on the number of cell strings. Also, in the memory block BLK, the number of cell transistors may increase or decrease, the height of the memory block BLK may increase or decrease depending on the number of cell transistors, and the number of lines connected with the cell transistors may increase or decrease depending on the number of cell transistors.

The memory block BLK may include a plurality of memory pages. For example, the first memory cells MC1 of the cell strings CS11, CS12, CS21, and CS22 connected with the first word lines WL1 may be referred to as a "first physical page". In some example embodiments, one physical page may correspond to a plurality of logical pages. For example, in the case where a memory cell is a triple level cell (TLC) storing information corresponding to 3 bits, a physical page may correspond to 3 logical pages. A multi-level cell storing two or more bits will be described in detail with reference to FIGS. 5A, 5B, and 5C together.

Referring again to FIGS. 1 and 3, the page buffer unit 126 may include a plurality of page buffers PB. The page buffer unit 126 may be connected with the memory cell array 125 through the bit lines BL. The page buffer unit 126 may read data from the memory cell array 125 in units of page, by sensing voltages of the bit lines BL.

The column decoder 127 may receive the column address ADDC from the control logic 122. The column decoder 127 may decode the column address ADDC, and may provide the data read by the page buffer unit 126 to the I/O circuit 128 based on a decoding result.

The column decoder 127 may receive data from the I/O circuit 128 through data lines DL. The column decoder 127 may receive the column address ADDC from the control logic 122. The column decoder 127 may decode the column address ADDC, and may provide the data received from the I/O circuit 128 to the page buffer unit 126 based on a decoding result. The page buffer unit 126 may store the data provided from the I/O circuit 128 in the memory cell array 125 through the bit lines BL in units of page.

The I/O circuit 128 may be connected with the column decoder 127 through the data lines DL. The I/O circuit 128 may provide data received from the storage controller 110 to the column decoder 127 through the data lines DL. The I/O circuit 128 may output data received through the data lines DL to the storage controller 110.

The address ADD, the command CMD, and the data described with reference to FIG. 3 may be transmitted/received through the non-volatile memory interface circuit 118 of the storage controller 110 of FIG. 2.

Figure 5A:
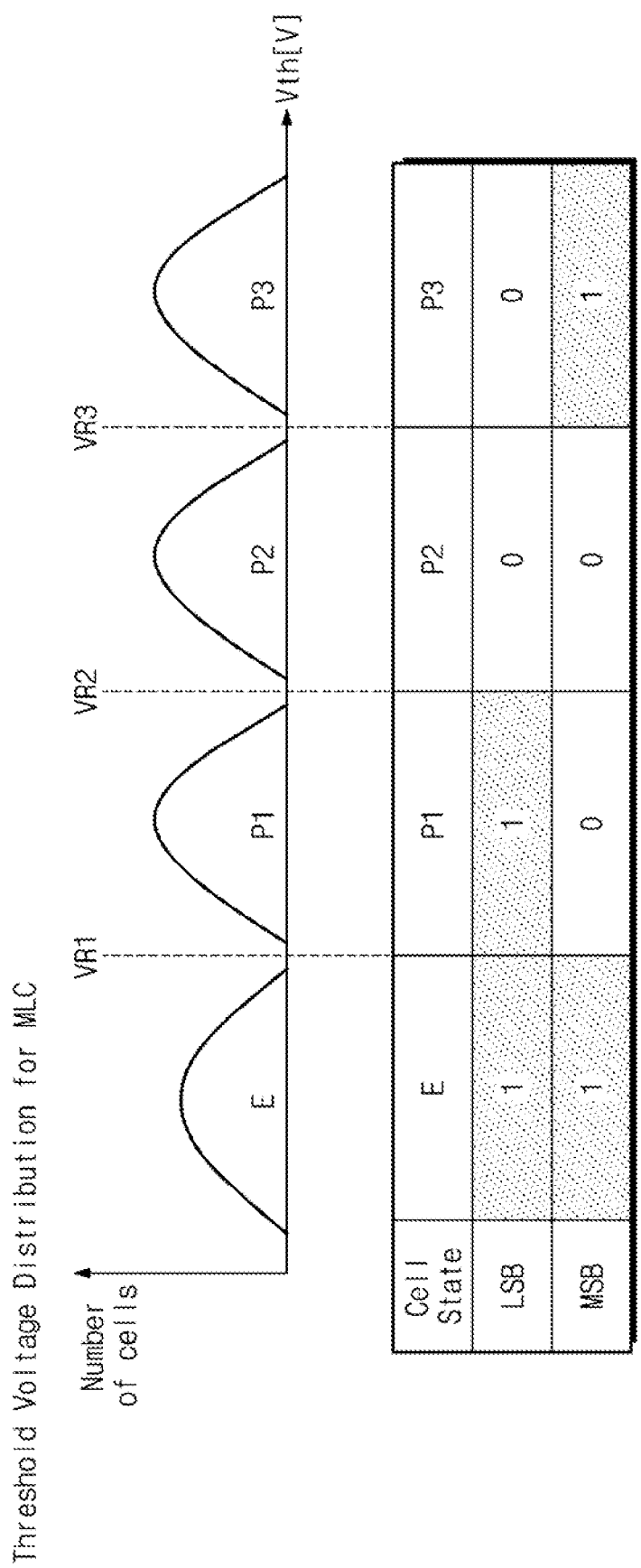
FIG. 5A is a diagram illustrating threshold voltage distributions of multi-level cells according to some example embodiments.

FIG. 5A is a diagram illustrating threshold voltage distributions of multi-level cells according to some example embodiments.

A graph of threshold voltage distributions of multi-level cells MLC storing 2 bits and a bit table for each page corresponding to the threshold voltage distributions are illustrated in FIG. 5A. Below, for convenience of description, the multi-level cell MLC is intended to refer to a memory cell storing 2 bits, a memory cell storing 3 bits is referred to as a "triple level cell TLC", and a memory cell storing 4 bits is referred to as a "quadruple level cell QLC".

In the graph of the multi-level cell MLC, a horizontal axis represents a threshold voltage (e.g., a level of a threshold voltage), and a vertical axis represents the number of cells.

The multi-level cell MLC may have one of an erase state "E" and first to third programming states P1, P2, and P3 in which the threshold voltage distribution sequentially increases.

In the multi-level cell MLC, a first read voltage VR1 may be a voltage for distinguishing the erase state "E" from the first programming state P1. A second read voltage VR2 may be a voltage for distinguishing the first programming state P1 from the second programming state P2. A third read voltage VR3 may be a voltage for distinguishing the second programming state P2 from the third programming state P3.

Referring to the table of the multi-level cell MLC, a most significant bit MSB and a least significant bit LSB according to a cell state are illustrated. A physical page corresponding to the multi-level cell MLC storing 2 bits may correspond to a first logical page and a second logical page. In the multi-level cell MLC, the first logical page may indicate the least significant bit LSB, and the second logical page may indicate the most significant bit MSB.

In some example embodiments, each of the first to third read voltages VR1 to VR3 of the multi-level cell MLC may correspond to one of a plurality of logical pages. For example, in the multi-level cell MLC, a read operation corresponding to the first logical page may be performed based on the second read voltage VR2. A read operation corresponding to the second logical page may be performed based on the first read voltage VR1 and the third read voltage VR3.

Figure 5B:
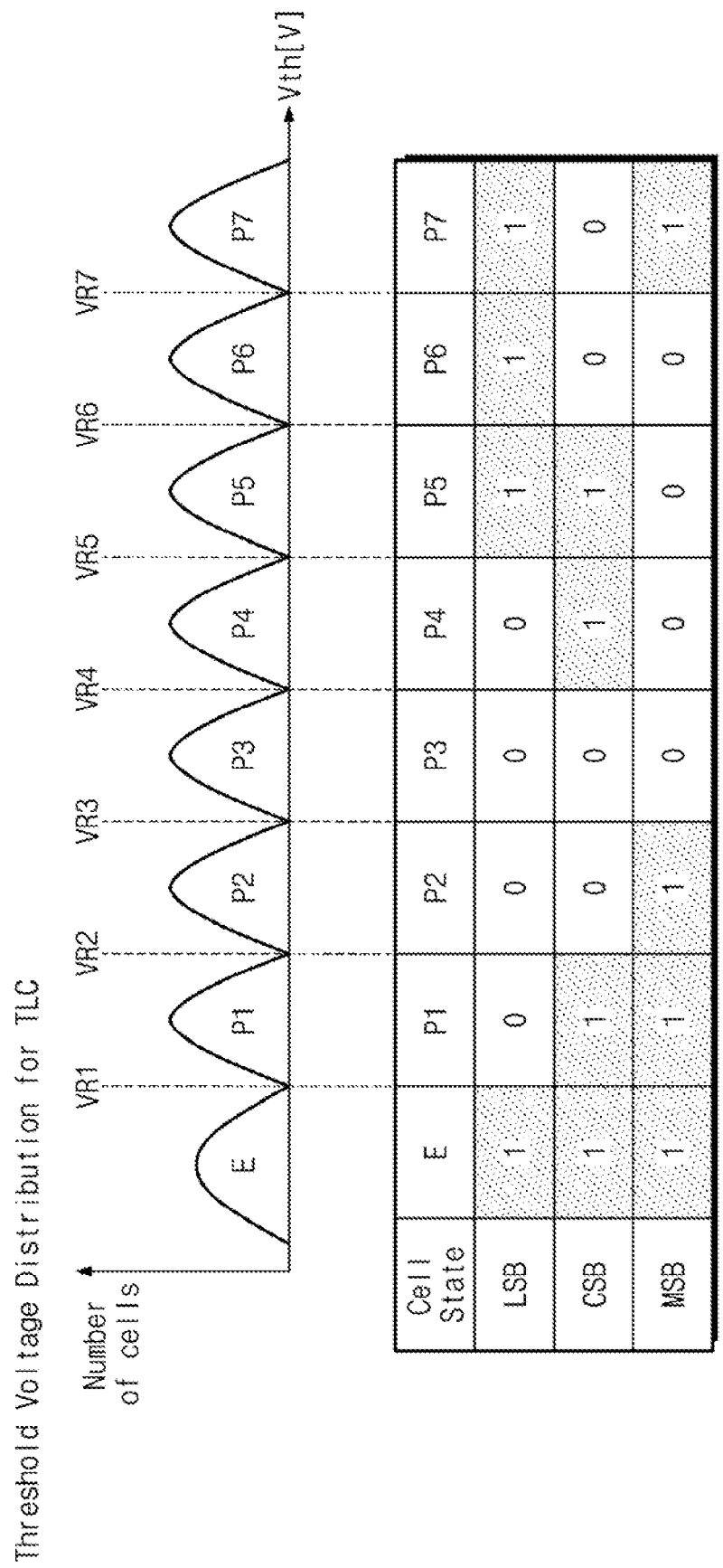
FIG. 5B is a diagram illustrating threshold voltage distributions of triple level cells according to some example embodiments.

FIG. 5B is a diagram illustrating threshold voltage distributions of triple level cells according to some example embodiments.

A graph of threshold voltage distributions of the triple level cells TLC storing 3 bits and a bit table for each page corresponding to the threshold voltage distributions are illustrated in FIG. 5B.

In the graph of the triple level cell TLC, a horizontal axis represents a threshold voltage (e.g., a level of a threshold voltage), and a vertical axis represents the number of cells.

The triple level cell TLC may have one of an erase state "E" and first to seventh programming states P1, P2, P3, P4, P5, P6, and P7 in which threshold voltage distributions sequentially increase.

In the triple level cell TLC, a first read voltage VR1 may be a voltage for distinguishing the erase state "E" from the first programming state P1. Likewise, each of second to seventh read voltages VR2 to VR7 may be a voltage for distinguishing each of the second to seventh programming states P2 to P7 from a previous state (i.e., an immediately previous state having a low threshold voltage distribution).

Referring to the table of the triple level cell TLC, a least significant bit LSB, a center significant bit CSB, and a most significant bit MSB according to a cell state are illustrated. A physical page corresponding to the triple level cell TLC storing 3 bits may correspond to a first logical page, a second logical page, and a third logical page. In the triple level cell TLC, the first logical page may indicate the least significant bit LSB, the second logical page may indicate the center significant bit CSB, and the third logical page may indicate the most significant bit MSB.

In some example embodiments, each of the first to seventh read voltages VR1 to VR7 of the triple level cell TLC may correspond to one of a plurality of logical pages. For example, in the triple level cell TLC, a read operation corresponding to the first logical page may be performed based on the first read voltage VR1 and the fifth read voltage VR5. A read operation corresponding to the second logical page may be performed based on the second read voltage VR2, the fourth read voltage VR4, and the sixth read voltage VR6. A read operation corresponding to the third logical page may be performed based on the third read voltage VR3 and the seventh read voltage VR7.

Figure 5C:
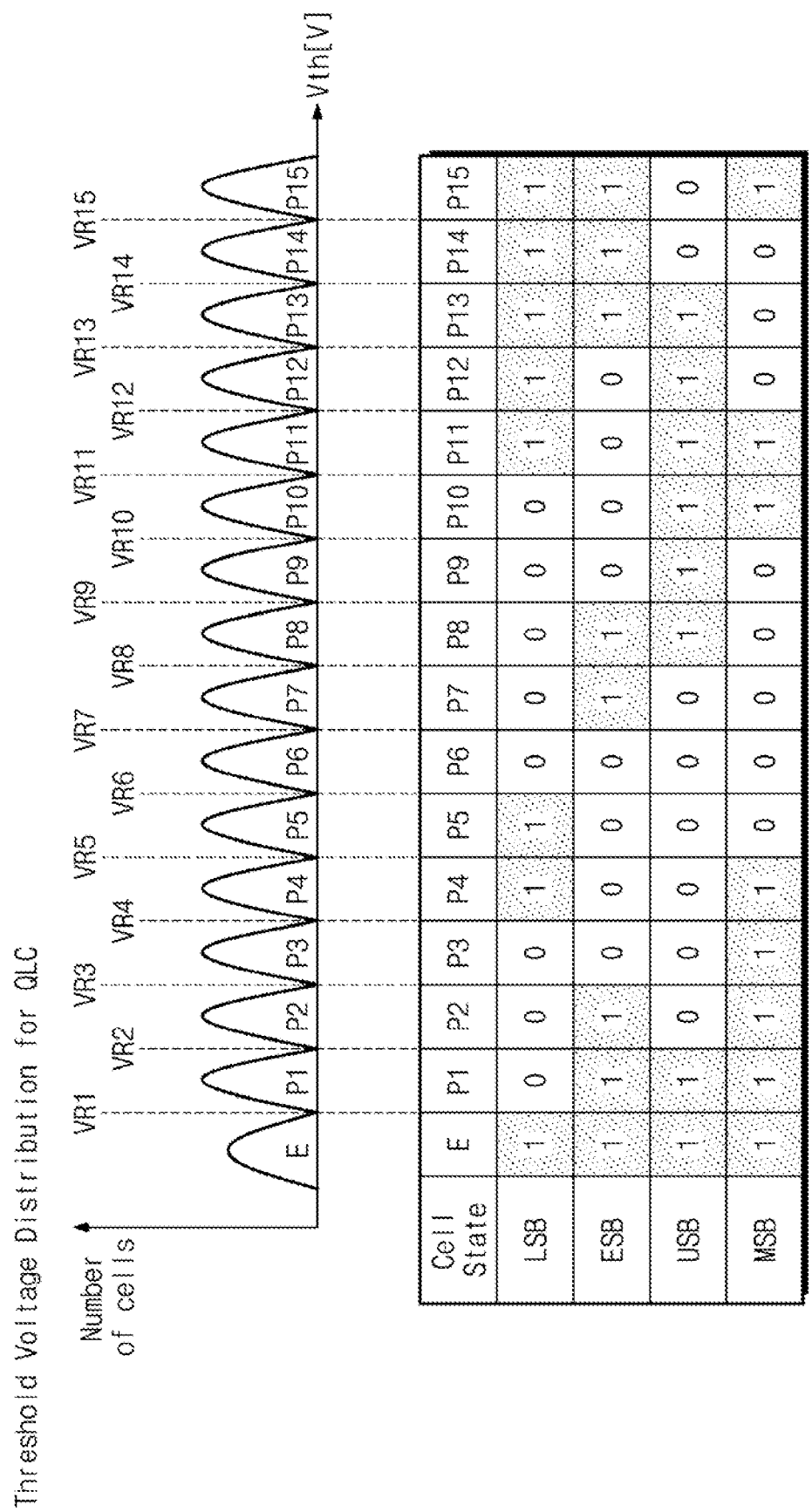
FIG. 5C is a diagram illustrating threshold voltage distributions for quadruple level cells, according to some example embodiments.

FIG. 5C is a diagram illustrating threshold voltage distributions for quadruple level cells, according to some example embodiments.

A graph of threshold voltage distributions of the quadruple level cells QLC storing 4 bits and a bit table for each page corresponding to the threshold voltage distributions are illustrated in FIG. 5C.

In the graph of the quadruple level cell QLC, a horizontal axis represents a threshold voltage (e.g., a level of a threshold voltage), and a vertical axis represents the number of cells.

The quadruple level cell QLC may have one of an erase state "E" and first to fifteenth programming states P1, P2, P3, P4, P5, P6, P7, P8, P9, P10, P11, P12, P13, P14, and P15 in which threshold voltage distributions sequentially increase.

In the quadruple level cell QLC, a first read voltage VR1 may be a voltage for distinguishing the erase state "E" from the first programming state P1. Likewise, each of second to fifteenth read voltages VR2 to VR15 may be a voltage for distinguishing each of the second to fifteenth programming states P2 to P15 from a previous state (i.e., an immediately previous state having a low threshold voltage distribution).

Referring to the table of the quadruple level cell QLC, a least significant bit LSB, a first center significant bit ESB, a second center significant bit USB, and a most significant bit MSB according to a cell state are illustrated. A physical page corresponding to the quadruple level cell QLC storing 4 bits may correspond to a first logical page, a second logical page, a third logical page, and a fourth logical page. In the quadruple level cell QLC, the first logical page may indicate the least significant bit LSB, the second logical page may indicate the first center significant bit ESB, the third logical page may indicate the second center significant bit USB, and the fourth logical page may indicate the most significant bit MSB.

In some example embodiments, each of the first to fifteenth read voltages VR1 to VR15 of the quadruple level cell QLC may correspond to one of a plurality of logical pages. For example, in the quadruple level cell QLC, a read operation corresponding to the first logical page may be performed based on the first, fourth, sixth, and eleventh read voltages VR1, VR4, VR6, and VR11. A read operation corresponding to the second logical page may be performed based on the third, seventh, ninth, and thirteenth read voltages VR3, VR7, VR9, and VR13. A read operation corresponding to the third logical page may be performed based on the second, eighth, and fourteenth read voltages VR2, VR8, and VR14. A read operation corresponding to the fourth logical page may be performed based on the fifth, tenth, twelfth, and fifteenth read voltages VR5, VR10, VR12, and VR15.

As described above, the states and the read voltages of the multi-level cell MLC, the triple level cell TLC, and the quadruple level cell QLC are described with reference to FIGS. 5A, 5B, and 5C. However, read voltages corresponding to each logical page may be variously changed or modified, and one memory cell may store 5 or more bits.

Figure 6:
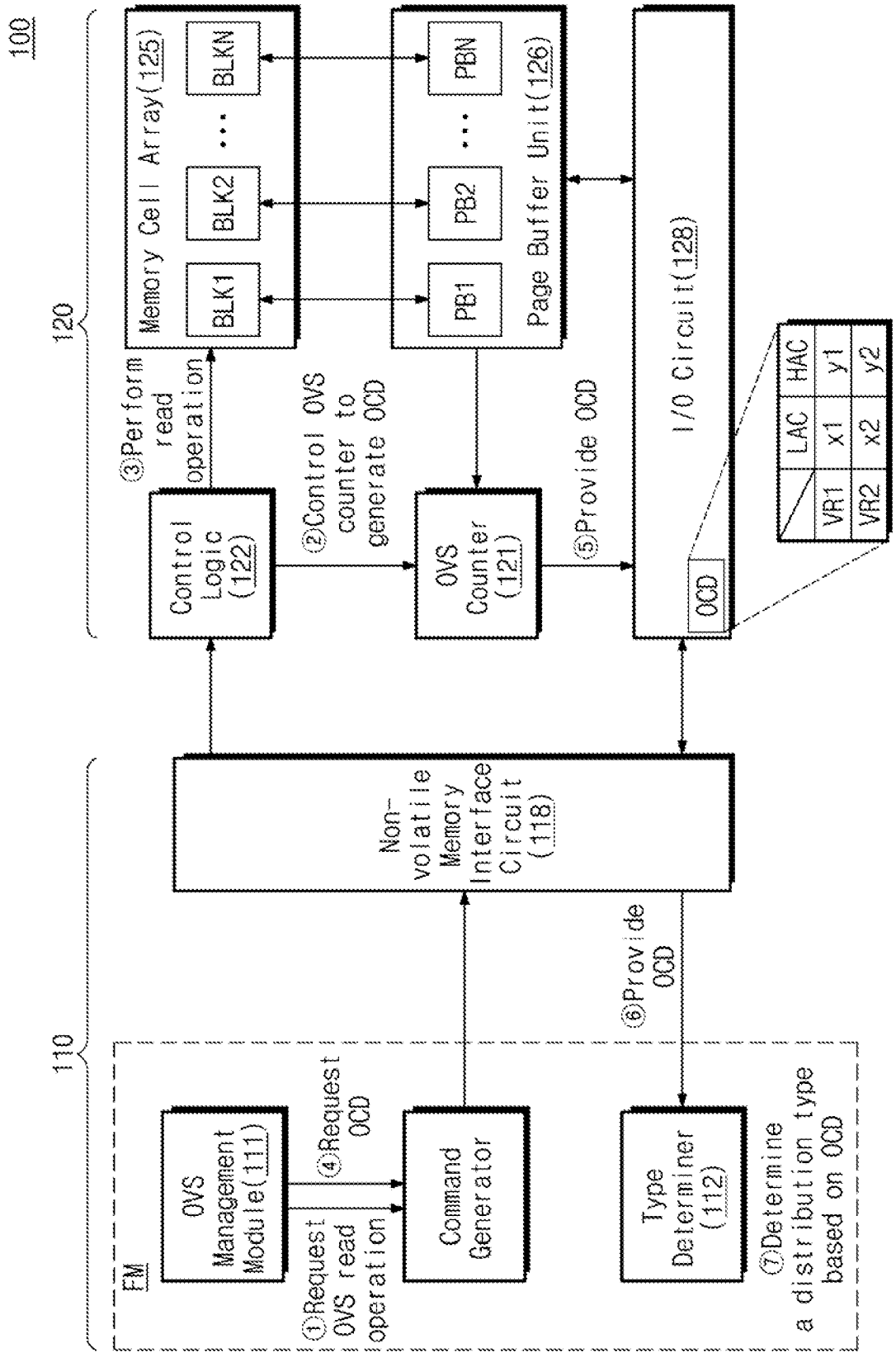
FIG. 6 is a diagram describing an operating method of a storage device according to some example embodiments.

FIG. 6 is a diagram describing an operating method of a storage device according to some example embodiments.

Referring to FIG. 6, the storage device 100 may include the storage controller 110 and the non-volatile memory device 120.

The storage controller 110 may include the firmware memory FM and the non-volatile memory interface circuit 118.

The firmware memory FM may include the OVS management module 111, the type determiner 112, and a command generator.

The OVS management module 111, the type determiner 112, and the non-volatile memory interface circuit 118 are similar to the OVS management module 111, the type determiner 112, and the non-volatile memory interface circuit 118 of FIG. 2, and thus, additional description will be omitted to avoid redundancy.

The firmware memory FM may include the command generator. The command generator may generate a command directing an operation to be performed by the non-volatile memory device 120, such as a read operation, a write operation, or an erase operation. The command generator may generate the command including the OVS read request, under control of the OVS management module 111. In another implementation, the command generator may be implemented with a separate hardware device.

The non-volatile memory device 120 may include the OVS counter 121, the control logic 122, the memory cell array 125, the page buffer unit 126, and the I/O circuit 128.

The OVS counter 121, the control logic 122, the memory cell array 125, the page buffer unit 126, and the I/O circuit 128 are similar to the OVS counter 121, the control logic 122, the memory cell array 125, the page buffer unit 126, and the I/O circuit 128 of FIG. 3, and thus, additional description will be omitted to avoid redundancy.

Below, an operating method of the storage device 100 according to some example embodiments will be described.

In a first operation ①, the OVS management module 111 may request the OVS read operation. The command generator may provide the command including the OVS read request to the non-volatile memory interface circuit 118 under control of the OVS management module 111. The non-volatile memory interface circuit 118 may provide the command including the OVS read request to the non-volatile memory device 120. The OVS read request may direct an operation of reading data stored in the memory cell array 125 and generating OVS count data OCD corresponding to the read data.

In a second operation ②, based on the command in the first operation ①, the control logic 122 may allow the OVS counter 121 to generate the OVS count data corresponding to the OVS read operation.

In a third operation ③, the control logic 122 may perform the read operation based on the command in the first operation ①. In this case, the read operation may refer to the operation of reading data stored in the memory cell array 125. The data read by the read operation may be used for the OVS counter 121 to generate the OVS count data.

For example, the memory cell array 125 may provide data stored in memory blocks BLK1 to BLKN to the page buffer unit 126 in units of page. Page buffers PB1 to PBN of the page buffer unit 126 may store the data of the memory blocks BLK1 to BLKN. While the read operation according to the third operation ③ is performed, the OVS counter 121 may generate the OVS count data OCD with reference to the page buffer unit 126.

The OVS count data OCD may be generated with respect to a memory region in the memory cell array 125. For example, the memory region may correspond to a set of a plurality of memory cells, such as a memory channel, a memory chip, a memory plane, or a memory block in the non-volatile memory device 120.

The OVS count data OCD may include a low area count value and a high area count value that are associated with each of a plurality of read voltages. The low area count value may refer to a value that is obtained by counting a number of memory cells each having a threshold voltage within a voltage level section lower than the corresponding read voltage. The high area count value may refer to a value that is obtained by counting a number of memory cells each having a threshold voltage within a voltage level section higher than the corresponding read voltage.

For example, the OVS count data OCD may include "x1", "y1", "x2", and "y2", where "x1" may be a value of a low area count LAC of the first read voltage VR1, "y1" may be a value of a high area count HAC of the first read voltage VR1, "x2" may be a value of a low area count LAC of the second read voltage VR2, and "y2" may be a value of a high area count HAC of the second read voltage VR2.

The read voltages of the OVS count data OCD may correspond to the same logical page. For example, in the case of reading the least significant bit LSB of the multi-level cell MLC, the OVS count data may include count values (i.e., a low area count value and a high area count value) of the second read voltage VR2. In the case of reading the most significant bit MSB of the multi-level cell MLC, the OVS count data may include count values of each of the first and third read voltages VR1 and VR3 (refer to FIG. 5A).

For example, in the case of reading the least significant bit LSB of the triple level cell TLC, the OVS count data may include count values of each of the first and fifth read voltages VR1 and VR5. In the case of reading the center significant bit CSB of the triple level cell TLC, the OVS count data may include count values of each of the second, fourth, and sixth read voltages VR2, VR4, and VR6. In the case of reading the most significant bit MSB of the triple level cell TLC, the OVS count data may include count values of each of the third and seventh read voltages VR3 and VR7 (refer to FIG. 5B).

For example, in the case of reading the least significant bit LSB of the quadruple level cell QLC, the OVS count data may include count values of each of the first, fourth, sixth, and eleventh voltages VR1, VR4, VR6, and VR11. In the case of reading the first center significant bit ESB of the quadruple level cell QLC, the OVS count data may include count values of each of the third, seventh, ninth, and thirteenth voltages VR3, VR7, VR9, and VR13. In the case of reading the second center significant bit USB of the quadruple level cell QLC, the OVS count data may include count values of each of the second, eighth, and fourteenth voltages VR2, VR8, and VR14. In the case of reading the most significant bit MSB of the quadruple level cell QLC, the OVS count data may include count values of each of the fifth, tenth, twelfth, and fifteenth voltages VR5, VR10, VR12, and VR15 (refer to FIG. 5C).

In a fourth operation ④, the OVS management module 111 may request the OVS count data OCD. The command generator may provide the command including the request for the OVS count data OCD to the non-volatile memory interface circuit 118 under control of the OVS management module 111. The non-volatile memory interface circuit 118 may provide the command including the request for the OVS count data OCD to the non-volatile memory device 120.

In a fifth operation ⑤, the OVS counter 121 may provide the OVS count data OCD to the I/O circuit 128 based on the command in the fourth operation ④. The I/O circuit 128 may provide the OVS count data OCD to the storage controller 110.

In a sixth operation ⑥, the non-volatile memory interface circuit 118 may provide the type determiner 112 with the OVS count data OCD received from the non-volatile memory device 120.

In a seventh operation ⑦, the type determiner 112 may determine a distribution type of the memory region based on the OVS count data OCD. For example, the type determiner 112 may determine the distribution type of the memory region to be one distribution type, from among a plurality of distribution types. The plurality of distribution types will be described in detail with reference to FIG. 8.

The type determiner 112 may determine the distribution type of the memory region to be one of the plurality of distribution types, further based on the OVS count data and additional information. For example, the additional information may include a variety of information, which is associated with threshold voltage distributions of a memory region, such as a page type such as the most significant bit MSB, the center significant bit CSB, and the least significant bit LSB, OVS count data of another page type with regard to the same memory region, and a voltage level of a word line applied to the memory region.

The storage controller 110 may determine a subsequent operation based on the distribution type determined by the type determiner 112, such as a read reclaim operation, a map-in operation, or a read retry operation.

The read reclaim operation may refer to an operation of copying data of a degraded memory region to another memory region for the purpose of maintaining the reliability of data. The map-in operation may refer to an operation of mapping a physical address (i.e., an address of the non-volatile memory device 120) of data having an error within an allowable range onto a logical address (i.e., an address of a host). The read retry operation may refer to an operation of changing a read voltage level considering that a threshold voltage distribution decreases over time, and again reading data by using the changed read voltage level.

Figure 7:
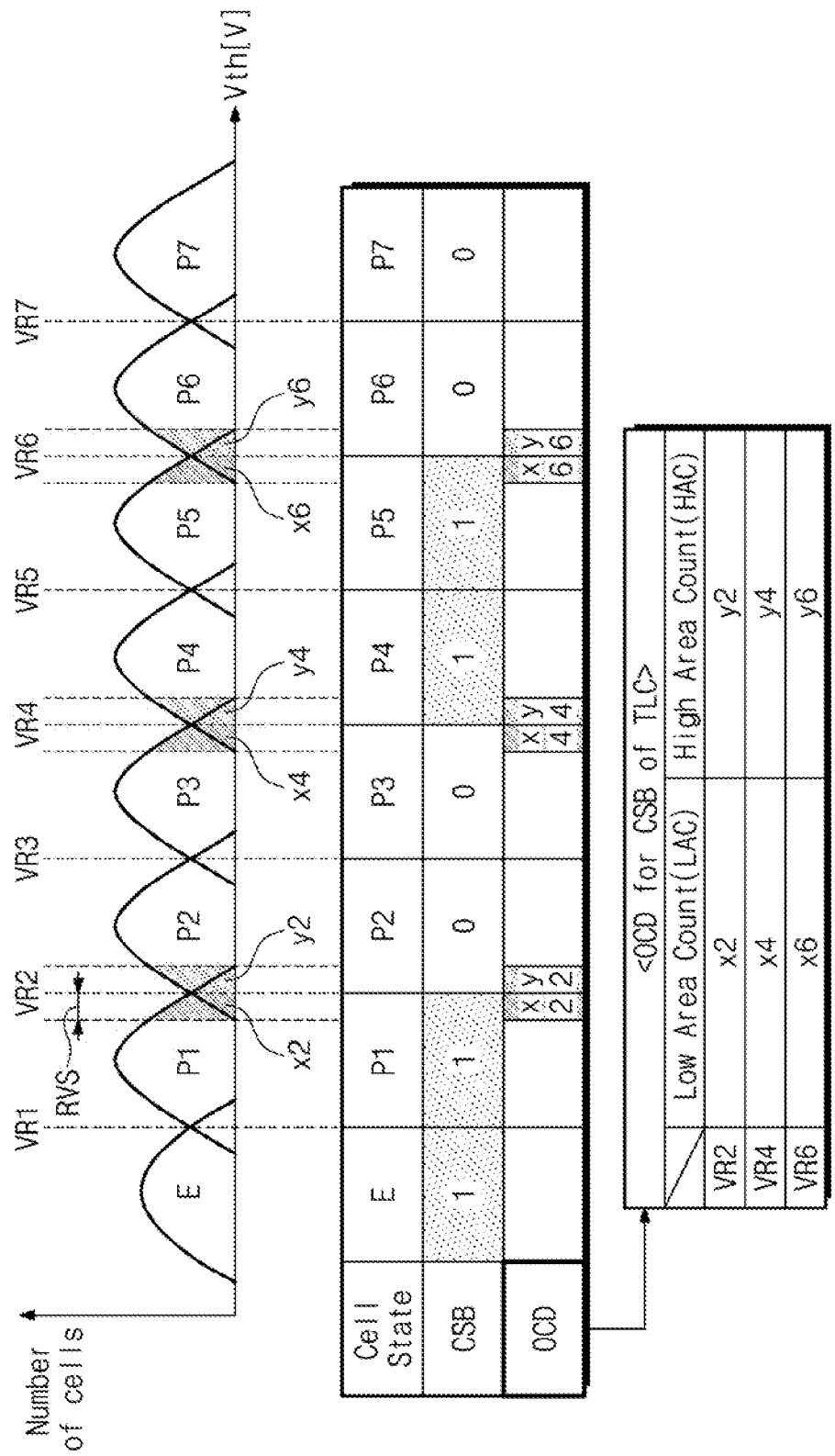
FIG. 7 is a diagram describing OVS count data of FIG. 6 according to some example embodiments.

FIG. 7 is a diagram describing OVS count data of FIG. 6 according to some example embodiments.

A threshold voltage distribution graph and OVS count data OCD that are associated with the case of reading the center significant bit CSB of the triple level cell TLC will be described with reference to FIG. 7.

In the threshold voltage distribution graph, a horizontal axis represents a threshold voltage, and a vertical axis represents the number of memory cells.

The second, fourth, and sixth read voltages VR2, VR4, and VR6 may correspond to a logical page of the center significant bit CSB of the triple level cell TLC, "x2" and "y2" may be count values of the second read voltage VR2, "x4" and "y4" may be count values of the fourth read voltage VR4, and "x6" and "y6" may be count values of the sixth read voltage VR6.

The OVS count data OCD may include a low area count value and a high area count value that are associated with each of read voltages corresponding to the same logical page. In the case of reading the center significant bit CSB of the triple level cell TLC, the OVS count data may include count values of each of the second, fourth, and sixth read voltages VR2, VR4, and VR6.

For example, the OVS count data OCD may include "x2", "y2", "x4", "y4", "x6", and "y6", where "x2" may be a value of the low area count LAC of the second read voltage VR2, "x2" may be obtained by counting the number of memory cells each having a threshold voltage between the second read voltage VR2 and a voltage lower than the second read voltage VR2 as much as a reference voltage section RVS, "y2" may be a value of the high area count HAC of the second read voltage VR2, and "y2" may be obtained by counting the number of memory cells each having a threshold voltage between the second read voltage VR2 and a voltage higher than the second read voltage VR2 as much as the reference voltage section RVS.

As in the above description, "x4" may be a value of the low area count LAC of the fourth read voltage VR4, "y4" may be a value of the high area count HAC of the fourth read voltage VR4, "x6" may be a value of the low area count LAC of the sixth read voltage VR6, and "y6" may be a value of the high area count HAC of the sixth read voltage VR6. Each of "x4", "y4", "x6", and "y6" may be a value that is obtained by counting the number of memory cells each having a threshold voltage within the corresponding voltage level section.

As described above, the OVS count data OCD may individually indicate count values associated with each read voltage, instead of indicating a unified bit count value of the whole logical page. A correlation may exist between a set of individual count values and a distribution type. That is, the OVS count data OCD may be distribution information appropriate for distinguishing various kinds of distribution types.

FIG. 8 is a diagram describing a distribution type table according to some example embodiments.

Referring to FIG. 8, a distribution type table according to some example embodiments may include first to ninth distribution types.

The first distribution type may indicate a normal type. The normal type may be a distribution type indicating that threshold voltages of memory cells in a memory region are programmed normally.

The second distribution type may indicate a retention type. The retention type may be a distribution type indicating that threshold voltages of the memory cells decrease as a time passes from a time at which the memory cells in the memory region are programmed.

The third distribution type may indicate a read disturb type. The memory region may include memory cells connected with a first word line and memory cells connected with a second word line. The first word line and the second word line may be adjacent to each other. The read disturb type may be a distribution type indicating that threshold voltage distributions of the memory cells connected with the second word line are changed by a read operation of the memory cells connected with the first word line in the memory region.

The fourth distribution type may indicate a pre-programming type. In the case of a memory cell that has multiple programming levels, such as the quadruple level cell QLC, the programming operation may be divided into pre-programming and post-programming to improve the accuracy of a programming operation. A threshold voltage distribution that is formed after the pre-programming is performed may be mostly lower than a threshold voltage distribution of the normal type. A threshold voltage distribution that is formed after the post-programming is performed may be similar to the threshold voltage distribution of the normal type. The pre-programming type may be a distribution type indicating that only the pre-programming of the pre-programming and the post-programming is performed.

The fifth distribution type may indicate a one-shot type. The one-shot type may be a distribution type indicating that one-shot programming is performed in the memory region. The one-shot programming may mean an operation in which the memory cells in the memory region are programmed to have an erase state or a programming state of a single level cell (SLC).

The sixth distribution type may indicate a hot-carrier injection (HCI) type. The HCI type may be a distribution type indicating that a threshold voltage distribution(s) is changed by the HCI in the memory region. The HCI may mean that a threshold voltage distribution changes as electrons or holes whose mobility is excessively high are accumulated in an insulating layer due to a hardware factor of a memory cell.

The seventh distribution type may indicate a no-coupled word line (NCW) type. The NCW type may be a distribution type indicating that threshold voltage distributions are formed to be generally low as memory cells of other word lines adjacent to a word line connected with programmed memory cells are not programmed.

The eighth distribution type may indicate a sudden power off (SPO) type. The SPO type may be a distribution type indicating that programming is abnormally performed in the memory region due to the sudden power off of a storage device.

The ninth distribution type may indicate an erase type. The erase type may be a distribution type indicating that the memory cells in the memory region are not yet programmed.

Figure 9:
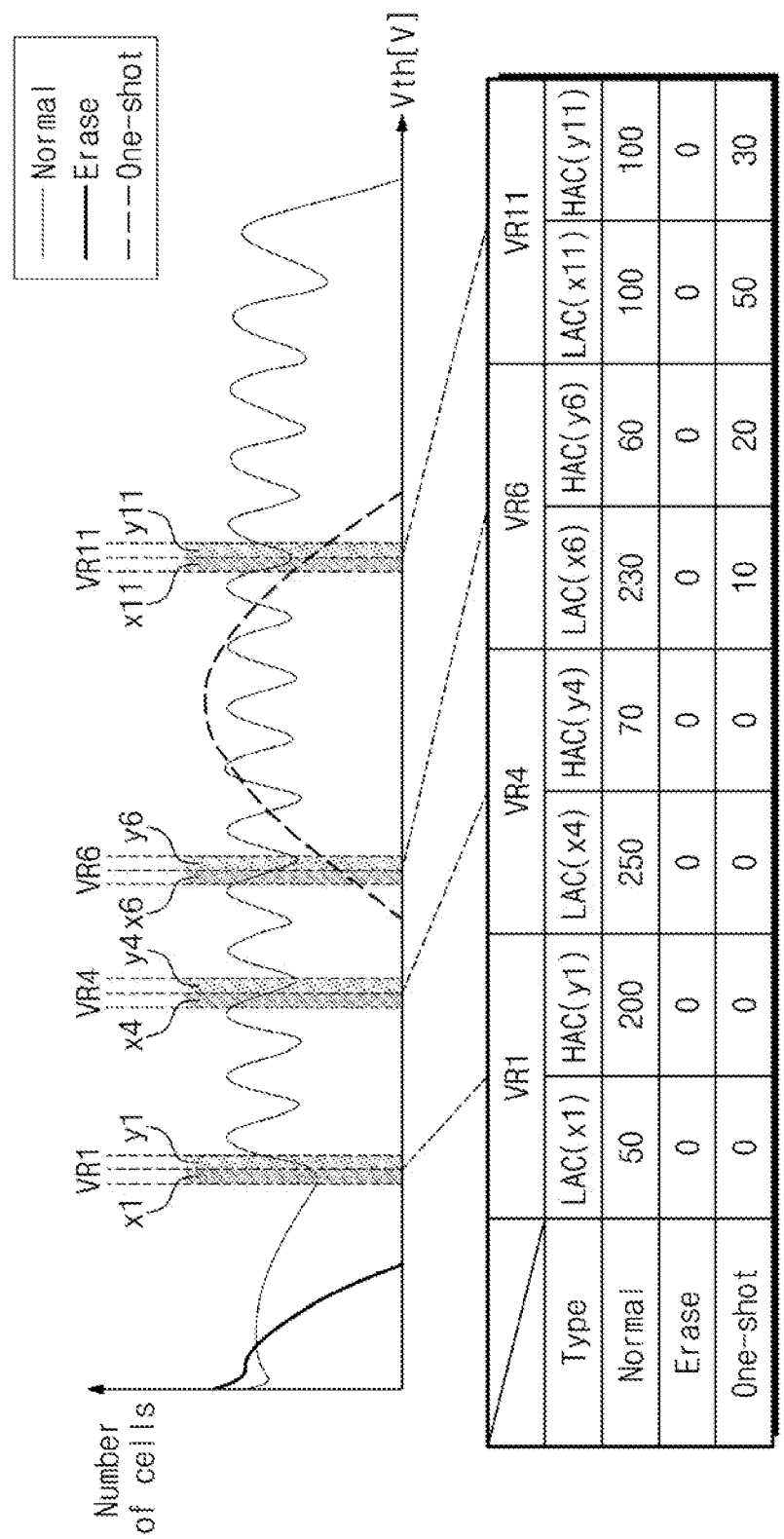
FIG. 9 is a diagram describing some distribution types according to some example embodiments.

FIG. 9 is a diagram describing some distribution types according to some example embodiments.

A threshold voltage distribution graph and OVS count data OCD according to a distribution type, which are associated with the case of reading the least significant bit LSB of the quadruple level cell QLC, will be described with reference to FIG. 9.

In the threshold voltage distribution graph, a horizontal axis represents a threshold voltage, and a vertical axis represents the number of memory cells.

The first, fourth, sixth, and eleventh read voltages VR1, VR4, VR6, and VR11 may correspond to a logical page of the least significant bit LSB of the quadruple level cell QLC.

In FIG. 9, "x1" may be a value of the low area count LAC of the first read voltage VR1, and "y1" may be a value of the high area count HAC of the first read voltage VR1. As in the above description, "x4" and "y4" may be count values of the fourth read voltage VR4, "x6" and "y6" may be count values of the sixth read voltage VR6, and "x11" and "y11" may be count values of the eleventh read voltage VR11.

In some example embodiments, threshold voltage distributions of the memory region associated with the normal type, the erase type, and the one-shot type may be experimentally obtained.

A solid line in the threshold voltage distribution graph indicates a waveform of the normal type. In the OVS count data OCD of the normal type, "x1", "y1", "x4", "y4", "x6", "y6", "x11", and "y11" may be "50", "200", "250", "70", "230", "60", "100", and "100", respectively.

A bold solid line in the threshold voltage distribution graph indicates a waveform of the erase type. In the OVS count data OCD of the erase type, "x1", "y1", "x4", "y4", "x6", "y6", "x11", and "y11" may be "0".

A dashed line in the threshold voltage distribution graph indicates a waveform of the one-shot type. In the OVS count data OCD of the one-shot type, "x1", "y1", "x4", "y4", "x6", "y6", "x11", and "y11" may be "0", "0", "0", "0", "10", "20", "50", and "30", respectively.

Figure 10:
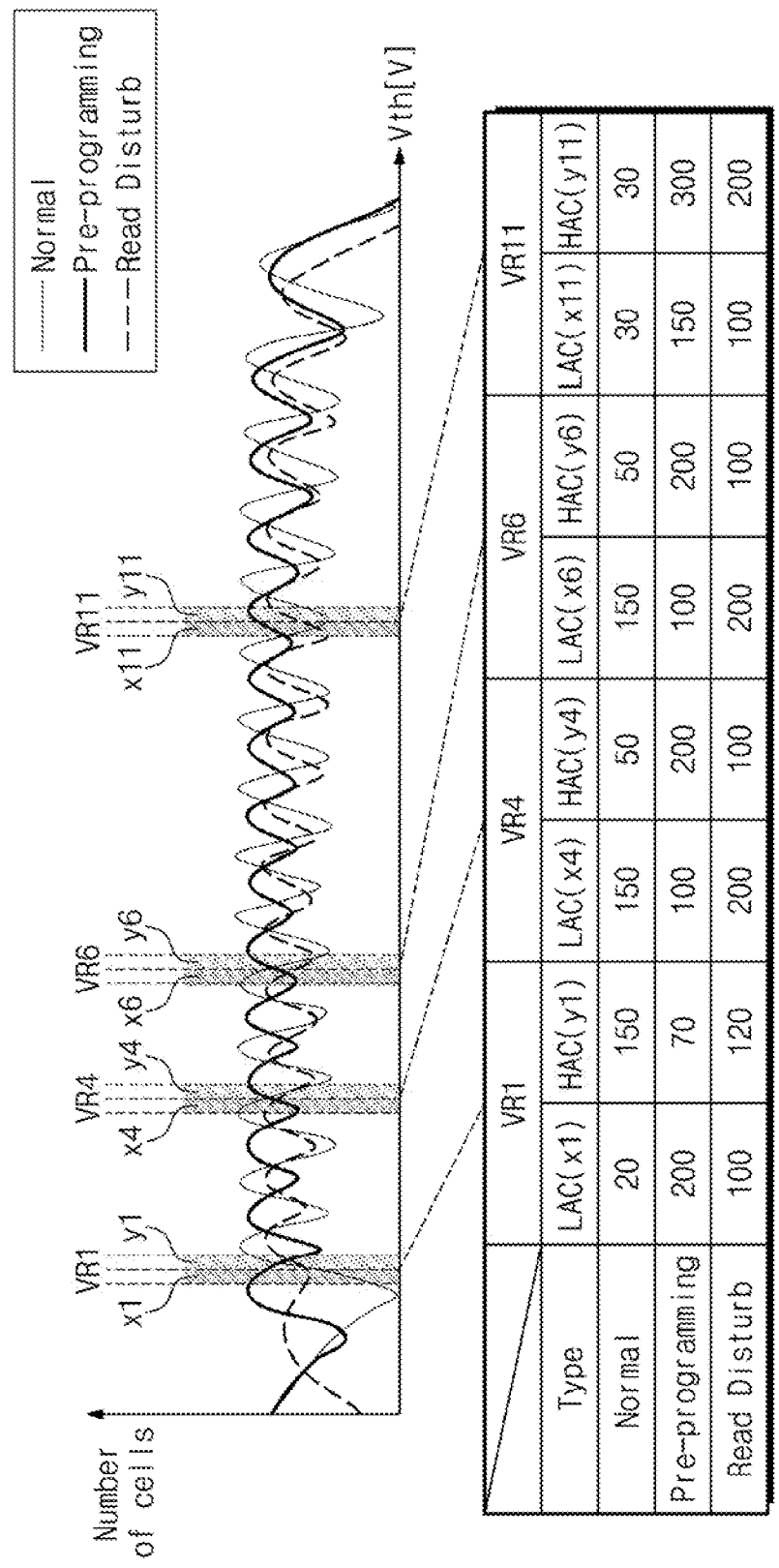
FIG. 10 is a diagram describing some distribution types according to some example embodiments.

FIG. 10 is a diagram describing some distribution types according to some example embodiments.

A threshold voltage distribution graph and OVS count data OCD according to a distribution type, which are associated with the case of reading the least significant bit LSB of the quadruple level cell QLC, will be described with reference to FIG. 10.

In the threshold voltage distribution graph, a horizontal axis represents a threshold voltage, and a vertical axis represents the number of memory cells.

The first, fourth, sixth, and eleventh read voltages VR1, VR4, VR6, and VR11 may correspond to a logical page of the least significant bit LSB of the quadruple level cell QLC.

In some example embodiments, threshold voltage distributions of the memory region associated with the normal type, the pre-programming type, and the read disturb type may be experimentally obtained.

A solid line in the threshold voltage distribution graph indicates a waveform of the normal type. In the OVS count data OCD of the normal type, "x1", "y1", "x4", "y4", "x6", "y6", "x11", and "y11" may be "20", "150", "150", "50", "150", "50", "30", and "30", respectively.

A bold solid line in the threshold voltage distribution graph indicates a waveform of the pre-programming type. In the OVS count data OCD of the pre-programming type, "x1", "y1", "x4", "y4", "x6", "y6", "x11", and "y11" may be "200", "70", "100", "200", "100", "200", "150", and "300", respectively.

A dashed line in the threshold voltage distribution graph indicates a waveform of the read disturb type. In the OVS count data OCD of the read disturb type, "x1", "y1", "x4", "y4", "x6", "y6", "x11", and "y11" may be "100", "120", "200", "100", "200", "100", "100", and "200", respectively.

Figure 11:
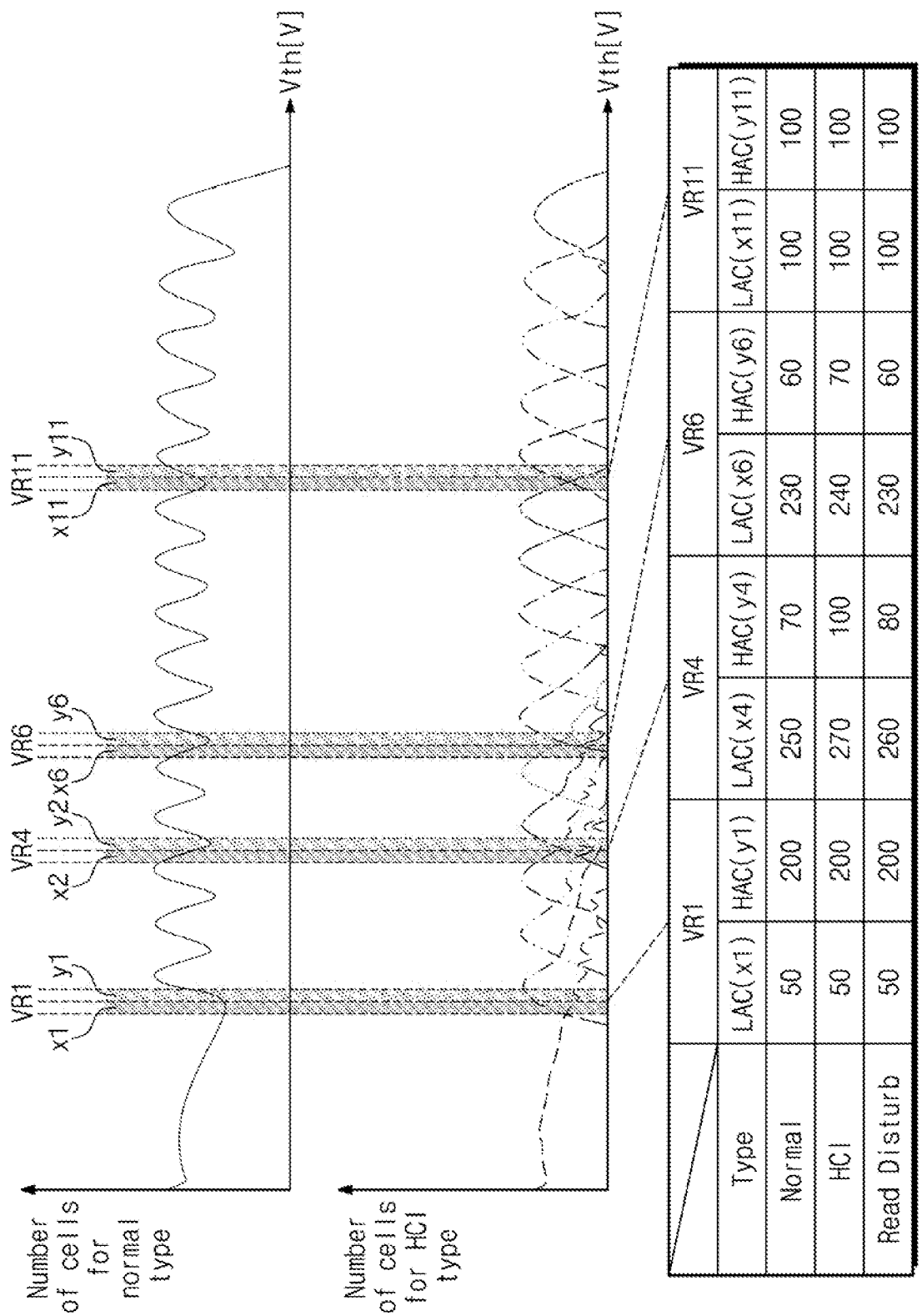
FIG. 11 is a diagram describing some distribution types according to some example embodiments.

FIG. 11 is a diagram describing some distribution types according to some example embodiments.

A threshold voltage distribution graph for the normal type, a threshold voltage distribution graph for the HCI type, and OVS count data OCD according to distribution types, which are associated with the case of reading the least significant bit LSB of the quadruple level cell QLC, will be described with reference to FIG. 11.

In the threshold voltage distribution graphs, a horizontal axis represents a threshold voltage, and a vertical axis represents the number of memory cells.

The first, fourth, sixth, and eleventh read voltages VR1, VR4, VR6, and VR11 may correspond to a logical page of the least significant bit LSB of the quadruple level cell QLC.

In some example embodiments, threshold voltage distributions of the memory region associated with the normal type, the HCI type, and the read disturb type may be experimentally obtained. With regard to the read disturb type, only the OVS count data OCD are illustrated for comparison with the HCI type, and a threshold voltage distribution graph is omitted to prevent a drawing from being complicated.

A solid line in the threshold voltage distribution graph associated with the normal type indicates a waveform of the normal type. In the OVS count data OCD of the normal type, "x1", "y1", "x4", "y4", "x6", "y6", "x11", and "y11" may be "50", "200", "250", "70", "230", "60", "100", and "100", respectively.

A waveform of the HCI type is illustrated by different types of lines depending on cell states (e.g., an erase state and first to fifteenth programming states) in the threshold voltage distribution graph associated with the HCI type. The whole waveform of the HCI type may correspond to a sum of the illustrated waveforms. In the OVS count data OCD of the HCI type, "x1", "y1", "x4", "y4", "x6", "y6", "x11", and "y11" may be "50", "200", "270", "100", "240", "70", "100", and "100", respectively.

With regard to the read disturb type, a graph of the read disturb type is omitted, and only the OVS count data OCD are illustrated. In the OVS count data OCD of the read disturb type, "x1", "y1", "x4", "y4", "x6", "y6", "x11", and "y11" may be "50", "200", "260", "80", "230", "60", "100", and "100", respectively.

The OVS count data OCD of the HCI type and the OVS count data OCD of the read disturb type may have different tendencies. For example, count values of the fourth and sixth read voltages VR4 and VR6 associated with the HCI type may be greater than count values of the fourth and sixth read voltages VR4 and VR6 associated with the normal type. Count values of the fourth read voltage VR4 associated with the read disturb type may be greater than count values of the fourth read voltage VR4 associated with the normal type. The type determiner 112 may distinguish the HCI type and the read disturb type based on a characteristic of the OVS count data OCD.

Threshold voltage distribution graphs and OVS count data OCD associated with various distribution types are described above with reference to FIGS. 9, 10, and 11. Because the distribution type may have the correlation relationship with count values of the OVS count data OCD, the type determiner 112 may determine the distribution type of the memory region based on the OVS count data OCD.

Figure 12:
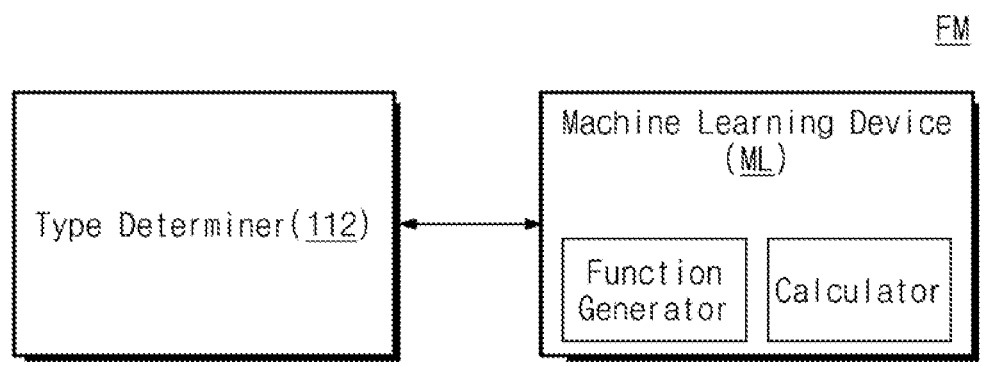
FIG. 12 is a diagram describing a machine learning device according to some example embodiments.

FIG. 12 is a diagram describing a machine learning device according to some example embodiments.

A machine learning device ML included in the firmware memory FM will be described with reference to FIG. 12. The machine learning device ML may assist an operation in which the type determiner 112 determines a distribution type.

As described in detail below, in the present example embodiment, the firmware memory FM of the storage controller 110 may include the machine learning device ML communicating with the type determiner 112. The firmware memory FM and the type determiner 112 may correspond to the firmware memory FM and the type determiner 112 of FIGS. 2 and 6. By way of example, the firmware memory FM is described as implementing the type determiner 112 and the machine learning device ML, but the type determiner 112 and the machine learning device ML may be implemented with a separate hardware device(s).

Referring to FIG. 12, the machine learning device ML of the firmware memory FM may include a function generator and a calculator.

The function generator may train for a relationship between the OVS count data OCD and the distribution type in a training step, and may generate a machine learning function.

The calculator may predict the distribution type based on the machine learning function and the OVS count data OCD.

The machine learning function may be a function trained in advance in the training step, before predicting the distribution type. In the machine learning function, the OVS count data may be input data, and the distribution type may be output data.

For example, the calculator of the machine learning device ML may input count values of the OVS count data to the machine learning function, may output a plurality of output data respectively corresponding to a plurality of distribution types by the machine learning function, and may select output data having the highest value, from among the plurality of output data.

Figure 13:
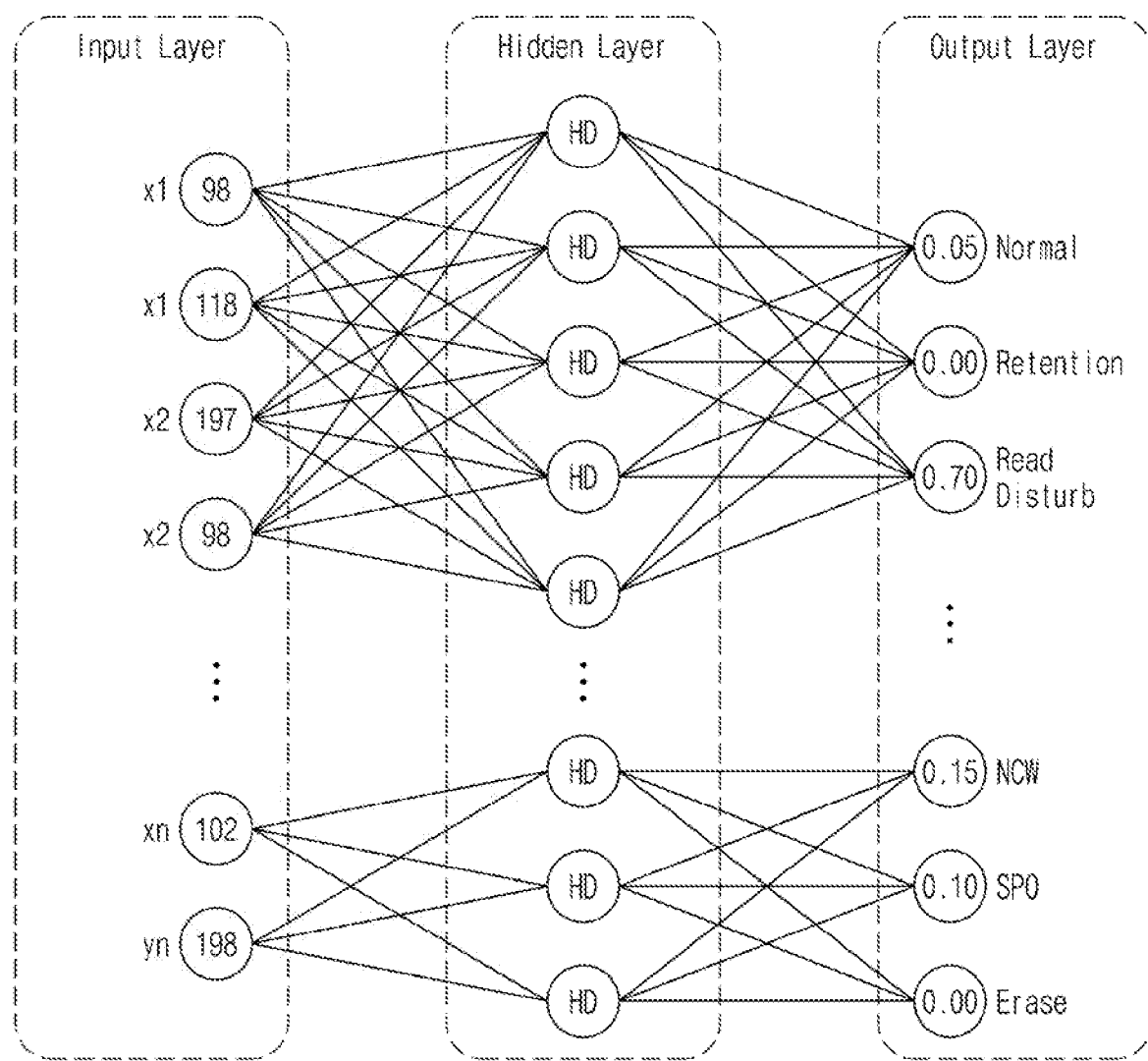
FIG. 13 is a diagram describing an operating method of a machine learning device of FIG. 12 according to some example embodiments.

FIG. 13 is a diagram describing an operating method of a machine learning device of FIG. 12 according to some example embodiments.

A machine learning function model of the machine learning device ML of FIG. 12 will be described with reference to FIG. 13. The machine learning function model may include an input layer, a hidden layer, and an output layer.

One hidden layer is illustrated for preventing a drawing to being complicated, but the number of hidden layers of the machine learning function model may be increased.

The input layer may include a plurality of input data. The plurality of input data may correspond to count values of the OVS count data OCD. For example, the OVS count data OCD may include the count values x1 and y1 of the first read voltage VR1, the count values x2 and y2 of the second read voltage VR2, and the count values xn and yn of the N-th read voltage VRN. Here, "N" is an arbitrary natural number. The input layer may use the count values x1, y1, x2, y2, ..., xn, and yn as the plurality of input data.

The hidden layer may include a plurality of hidden data. The hidden data may be obtained by calculating the plurality of input data and weights. For example, a weight may correspond to a solid line connecting layers in FIG. 13. A weight may be generated by training for a relationship between the OVS count data OCD and the distribution type in the training step of the machine learning device ML.

The output layer may include a plurality of output data. The plurality of output data may correspond to a plurality of distribution types, respectively. A value of output data may indicate the probability that a distribution type of a memory region corresponds to a relevant distribution type. A sum of all the output data in the output layer may be "1". The output layer may select output data having the highest value, from among the plurality of output data.

The machine learning device ML may determine (e.g., predict) the distribution type of the memory region to be a distribution type corresponding to the selected output data.

For example, the machine learning device ML may select output data having the highest value (e.g., 0.7 in FIG. 13), from among the plurality of output data. In the illustrated example, the machine learning device ML may therefore determine the distribution type of the memory region to be the read disturb type, corresponding to the selected output data having the highest value (0.7).

Figure 14:
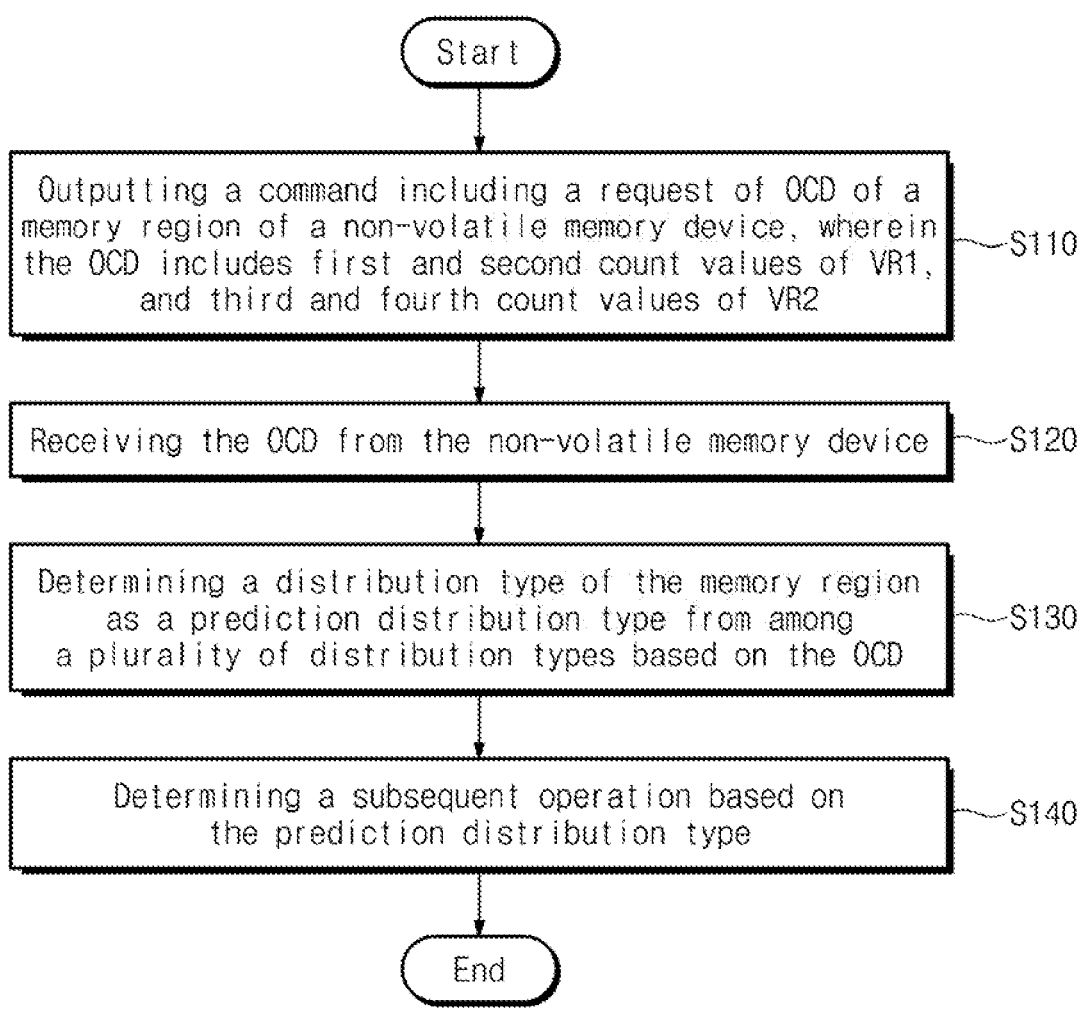
FIG. 14 is a flowchart describing an operating method of a storage controller according to some example embodiments.

FIG. 14 is a flowchart describing an operating method of a storage controller according to some example embodiments.

An operating method of a storage controller according to some example embodiments will be described with reference to FIG. 14. The storage controller may communicate with a non-volatile memory device. The storage controller may correspond to the storage controller 110 of FIGS. 1, 2, and 6.

In operation S110, the storage controller may provide the non-volatile memory device with a command including a request for the OVS count data OCD of a memory region in the non-volatile memory device. The OVS count data OCD may include a first count value and a second count value of a first read voltage, and a third count value and a fourth count value of a second read voltage.

The operating method of the storage controller may include outputting, to the non-volatile memory device, the command including the OVS read request for the memory region.

The first count value in operation S110 may indicate a number of memory cells corresponding to a low area count of the first read voltage, from among a plurality of memory cells in the memory region.

The second count value in operation S110 may indicate a number of memory cells corresponding to a high area count of the first read voltage, from among the plurality of memory cells in the memory region.

The third count value in operation S110 may indicate a number of memory cells corresponding to a low area count of the second read voltage, from among the plurality of memory cells in the memory region.

The fourth count value in operation S110 may indicate a number of memory cells corresponding to a high area count of the second read voltage, from among the plurality of memory cells in the memory region.

The first read voltage and the second read voltage in operation S110 may correspond to the same logical page.

In operation S120, the storage controller may receive the OVS count data OCD from the non-volatile memory device. The OVS count data OCD may be the OVS count data OCD requested in operation S110.

In operation S130, the storage controller may determine the distribution type of the memory region to be a predicted distribution type, from among a plurality of distribution types, based on the OVS count data OCD.

The plurality of distribution types in operation S130 may include the normal type, the retention type, the read disturb type, the pre-programming type, the HCI type, the NCW type, the SPO type, and the erase type.

In some example embodiments, in operation S130, the storage controller may determine the distribution type of the memory region to be the predicted distribution type, from among the plurality of distribution types, by using the machine learning device.

In operation S140, the storage controller may determine a subsequent operation based on the predicted distribution type determined in operation S130. The determination of the subsequent operation may mean the determination of an operation appropriate for the predicted distribution type regardless of whether the storage controller issues a command to the non-volatile memory device.

In some example embodiments, operation S140 may include providing the non-volatile memory device with a command indicating a subsequent operation to be performed in the non-volatile memory device. For example, the subsequent operation may include an operation determined depending on the predicted distribution type, such as a read reclaim operation, a map-in operation, or a read retry operation.

Figure 15:
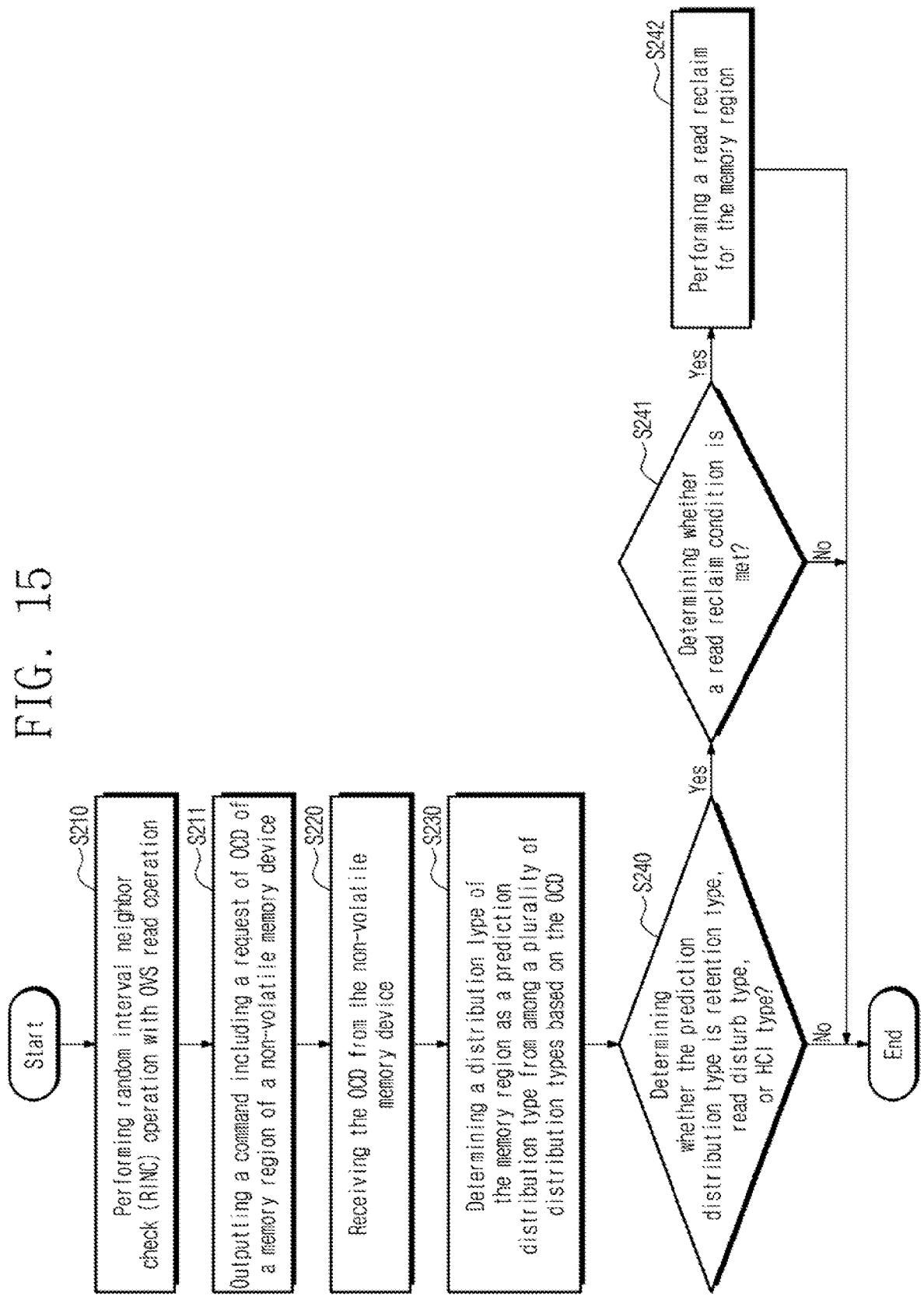
FIG. 15 is a flowchart describing an operating method of a storage controller according to some example embodiments.

FIG. 15 is a flowchart describing an operating method of a storage controller according to some example embodiments.

An operating method of a storage controller according to some example embodiments will be described with reference to FIG. 15. The storage controller may communicate with a non-volatile memory device. The storage controller may correspond to the storage controller 110 of FIGS. 1, 2, and 6.

Operation S220 and operation S230 are similar to operation S120 and operation S130 of FIG. 14, and thus, additional description will be omitted to avoid redundancy.

In operation S210, the storage controller may perform a random interval neighbor check (RINC) operation. The RINC operation may refer to a read operation that the storage controller performs for reliability verification, without intervention of a host, after the read operation is performed as much as the reference number of times. The RINC operation may include the OVS read request.

In operation S211, the storage controller may output a command including a request for the OVS count data OCD of a memory region in the non-volatile memory device, based on the RINC operation in operation S210. The OVS count data OCD may include the first and second count values of the first read voltage, and the third and fourth count values of the second read voltage.

In operation S240, the storage controller may determine whether the predicted distribution type determined in operation S230 is the retention type, the read disturb type, or the HCI type. For example, when the predicted distribution type is a distribution type different from the retention type, the read disturb type, and the HCI type, the storage controller may terminate the RINC operation. When the predicted distribution type is one of the retention type, the read disturb type, and the HCI type, the storage controller may perform operation S241.

In operation S241, the storage controller may determine whether the memory region meets a read reclaim condition. For example, when the number of uncorrectable errors detected by an ECC engine of the storage controller exceeds a read reclaim reference value, the storage controller may determine that the memory region meets the read reclaim condition.

When the memory region does not meet the read reclaim condition, the storage controller may terminate the RINC operation. When the memory region meets the read reclaim condition, the storage controller may perform operation S242.

In operation S242, the storage controller may perform the read reclaim operation on the memory region. For example, the storage controller may output a command including a read reclaim request for the memory region to the non-volatile memory device.

The RINC operation for determining a subsequent operation based on a distribution type is described above with reference to FIG. 15. Because the retention type, the read disturb type, and the HCI type are associated with degradation of a memory cell, the read reclaim operation may be performed before an error level increases excessively. In contrast, because the normal type, the pre-programming type, and the one-shot type have low association with degradation of a memory cell, the read reclaim operation may not be performed. Because the storage controller may omit additional operations (e.g., operation S241 and operation S242) associated with a distribution type not calling for the read reclaim operation, the I/O load and latency may decrease.

Figure 16:
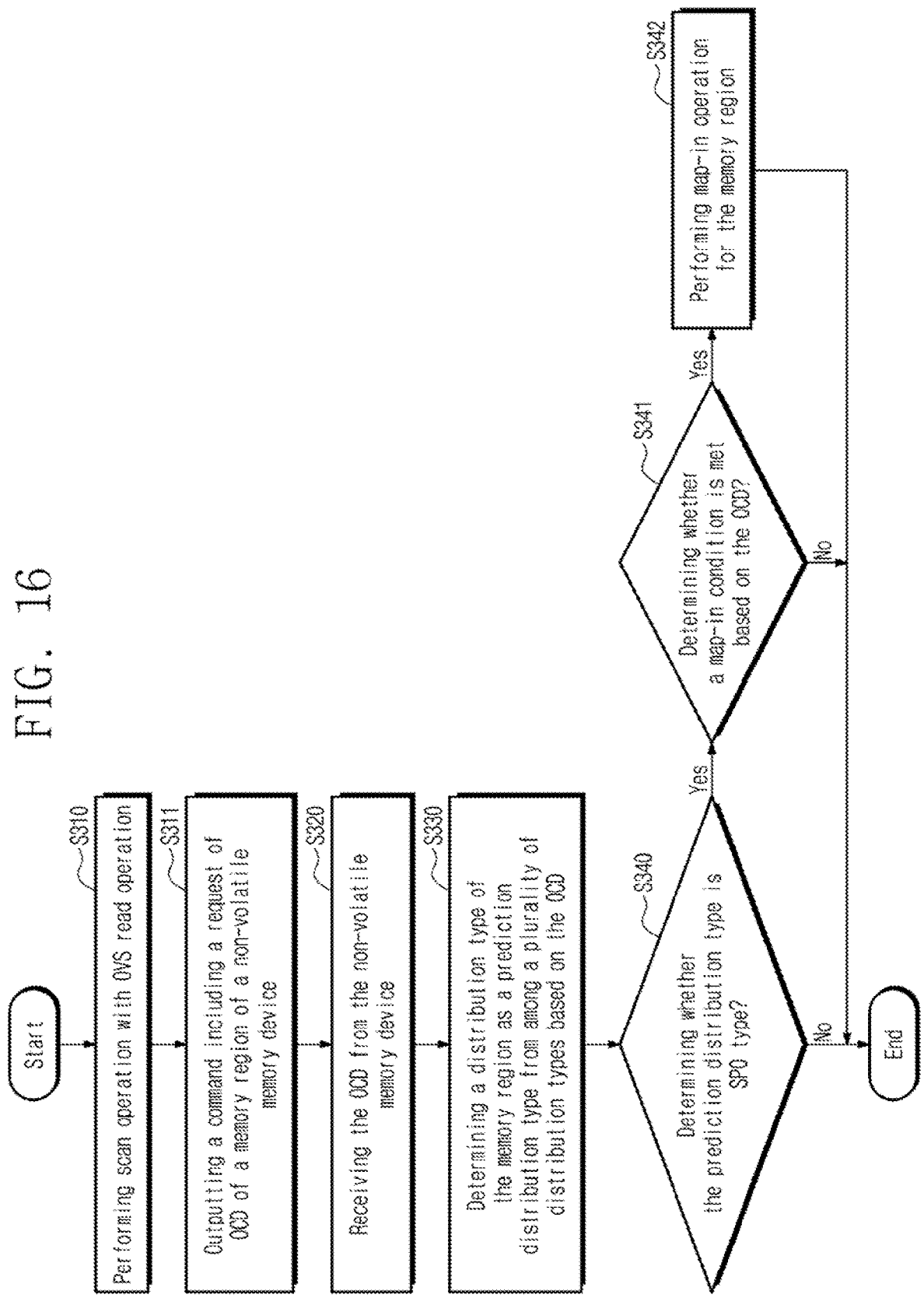
FIG. 16 is a flowchart describing an operating method of a storage controller according to some example embodiments.

FIG. 16 is a flowchart describing an operating method of a storage controller according to some example embodiments.

An operating method of a storage controller according to some example embodiments will be described with reference to FIG. 16. The storage controller may communicate with a non-volatile memory device. The storage controller may correspond to the storage controller 110 of FIGS. 1, 2, and 6.

Operation S320 and operation S330 are similar to operation S120 and operation S130 of FIG. 14, and thus, additional description will be omitted to avoid redundancy.

In operation S310, the storage controller may perform a scan operation. The scan operation may refer to an operation of aligning a mapped relationship between physical addresses of the non-volatile memory device and logical addresses of a host, e.g., when a power is supplied to a storage device.

In operation S311, the storage controller may output a command including a request for the OVS count data OCD of a memory region in the non-volatile memory device, based on the scan operation in operation S310. The OVS count data OCD may include the first and second count values of the first read voltage, and the third and fourth count values of the second read voltage.

In operation S340, the storage controller may determine whether the predicted distribution type determined in operation S330 is the SPO type. For example, when the predicted distribution type is a type different from the SPO type, the storage controller may terminate the scan operation. When the predicted distribution type is the SPO type, the storage controller may perform operation S341.

In operation S341, the storage controller may determine whether the memory region meets a map-in condition, based on the OVS count data OCD. For example, the storage controller may determine whether the memory region meets the map-in condition, by comparing the count values of the OVS count data OCD with map-in parameters.

When the memory region does not meet the map-in condition, the storage controller may terminate the scan operation. When the memory region meets the map-in condition, the storage controller may perform operation S342.

In operation S342, the storage controller may perform a map-in operation on the memory region. For example, the storage controller may store mapping information between a physical address (i.e., an address of the non-volatile memory device) of data having an error within an allowable range and a logical address (i.e., an address of a host) in a mapping table.

The scan operation for determining a subsequent operation based on a distribution type is described above with reference to FIG. 16. Because the SPO type is associated with an operation of supplying a power to the storage device, the map-in operation of the memory region meeting the map-in condition may be performed. In contrast, because the normal type, the retention type, and the read disturb type have low association with the operation of supplying a power to the storage device, the map-in operation may not be performed. Because the storage controller may omit additional operations (e.g., operation S341 and operation S342) associated with a distribution type not calling for the map-in operation, the I/O load and latency may decrease.

Figure 17:
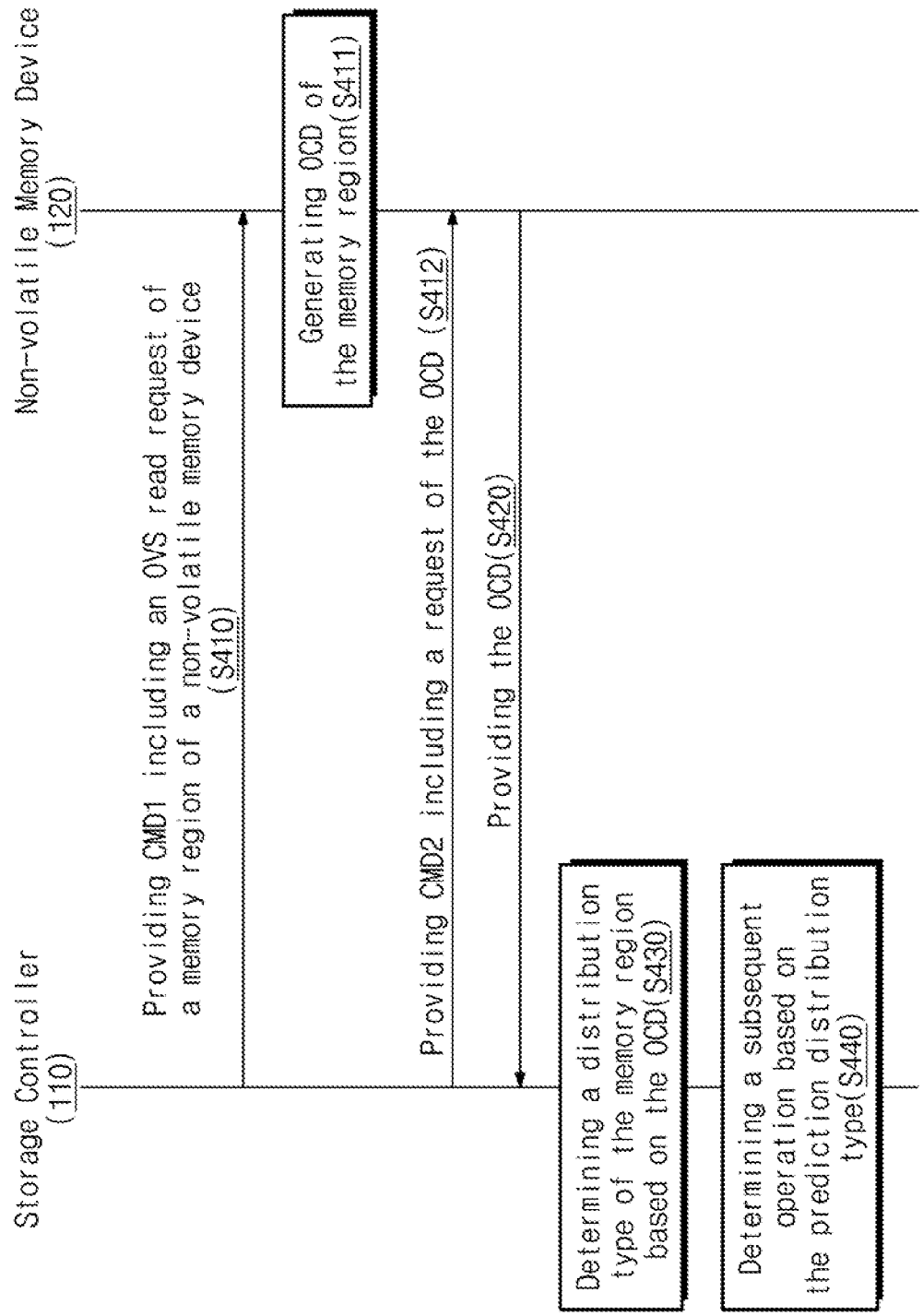
FIG. 17 is a flowchart illustrating an operating method of a storage device according to some example embodiments.

FIG. 17 is a flowchart illustrating an operating method of a storage device according to some example embodiments.

An operating method of a storage device according to embodiments of the present disclosure will be described with reference to FIG. 17. The storage device may include the storage controller 110 and the non-volatile memory device 120. The storage controller 110 may correspond to the storage controller 110 of FIGS. 1, 2, and 6. The non-volatile memory device 120 may correspond to the non-volatile memory device 120 of FIGS. 1, 3, and 6.

In operation S410, the storage controller 110 may provide the non-volatile memory device 120 with a first command CMD1 including the OVS read request for a memory region of the non-volatile memory device 120.

In operation S411, the non-volatile memory device 120 may generate the OVS count data OCD of the memory region based on the first command CMD1. The OVS count data OCD may include the first and second count values of the first read voltage, and the third and fourth count values of the second read voltage.

In operation S412, the storage controller 110 may provide the non-volatile memory device 120 with a second command CMD2 including a request for the OVS count data OCD.

In operation S420, the non-volatile memory device 120 may provide the OVS count data OCD to the storage controller 110 based on the second command CMD2 in operation S412.

In operation S430, the storage controller 110 may determine the distribution type of the memory region to be a predicted distribution type, from among a plurality of distribution types, based on the OVS count data OCD.

In operation S440, the storage controller 110 may determine a subsequent operation based on the predicted distribution type determined in operation S430. The storage controller 110 may provide the non-volatile memory device 120 with a third command CMD3 indicating a subsequent operation to the non-volatile memory device 120 based on the predicted distribution type determined in operation S430.

By way of summation and review, memory cells of the non-volatile memory device may have a programmed threshold voltage distribution corresponding to a bit value of data. A threshold voltage distribution may change due to various factors such as retention, read disturb, hot-carrier injection (HCI), and sudden power off (SPO). The change in the threshold voltage distribution may cause an increase of errors in data and the reduction of reliability. Thus, threshold voltage distribution types may be classified in connection with generating an appropriate subsequent command for read retry or read reclaim, depending on the classified types.

Embodiments may provide a storage controller determining a distribution type, a method of operating the same, and a method of operating a storage device including the same.

Embodiments may provide a storage controller in which the reliability of data is improved by generating an appropriate subsequent operation depending on a determined distribution type, an additional read operation may be omitted by obtaining distribution information by an on-chip valley search (OVS) read operation, and an accuracy of determining a distribution type may be improved by a machine learning device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated.

Components described in the detailed description with reference to terms "part", "unit", "module", "layer", etc., and function blocks illustrated in drawings may be implemented in the form of software, hardware, or a combination thereof. For example, the software may be a machine code, firmware, an embedded code, and application software, and the hardware may include an electrical circuit, an electronic circuit, a processor, a computer, an integrated circuit, integrated circuit cores, a pressure sensor, an inertial sensor, a microelectromechanical system (MEMS), a passive element, or a combination thereof.

Accordingly, it will be understood by those of skill in the art that various changes in form and details may be made without departing from the spirit and scope of the present invention as set forth in the following claims.

What is claimed is:

1. A method of operating a storage controller which communicates with a non-volatile memory device, the method comprising:
    outputting a first command including a request for on-chip valley search (OVS) count data of a memory region of the non-volatile memory device to the non-volatile memory device, wherein the OVS count data includes a first count value and a second count value of a first read voltage, and a third count value and a fourth count value of a second read voltage;
    receiving the OVS count data from the non-volatile memory device;
    determining a distribution type of the memory region to be a predicted distribution type, from among a plurality of distribution types, based on the OVS count data; and
    determining a subsequent operation, based on the predicted distribution type.

2. The method as claimed in claim 1, further comprising:
    outputting a second command including an OVS read request for the memory region to the non-volatile memory device, before outputting the first command,
    wherein the OVS count data are generated by performing, at the non-volatile memory device, an OVS read operation on each of the first read voltage and the second read voltage.

3. The method as claimed in claim 1, wherein the first count value indicates a number of memory cells corresponding to a low area count of the first read voltage, from among a plurality of memory cells of the memory region,
    wherein the second count value indicates a number of memory cells corresponding to a high area count of the first read voltage, from among the plurality of memory cells of the memory region,
    wherein the third count value indicates a number of memory cells corresponding to a low area count of the second read voltage, from among the plurality of memory cells of the memory region, and
    wherein the fourth count value indicates a number of memory cells corresponding to a high area count of the second read voltage, from among the plurality of memory cells of the memory region.

4. The method as claimed in claim 1, wherein the first read voltage and the second read voltage correspond to a same logical page.

5. The method as claimed in claim 1, wherein the memory region of the non-volatile memory device is implemented with a triple level cell (TLC) or a quadruple level cell (QLC),
    wherein the OVS count data further include a fifth count value and a sixth count value of a third read voltage, and
    wherein the first read voltage, the second read voltage, and the third read voltage correspond to a same logical page.

6. The method as claimed in claim 1, wherein the memory region of the non-volatile memory device is implemented with a QLC,
    wherein the OVS count data further include a fifth count value and a sixth count value of a third read voltage, and a seventh count value and an eighth count value of a fourth read voltage, and
    wherein the first read voltage, the second read voltage, the third read voltage, and the fourth read voltage correspond to a same logical page.

7. The method as claimed in claim 1, wherein the plurality of distribution types include:
    a normal type indicating that memory cells of the memory region are programmed normally;
    a retention type indicating that threshold voltages of the memory cells of the memory region decrease over time;
    a read disturb type indicating that a threshold voltage distribution of a second word line adjacent to a first word line in the memory region is changed depending on a read operation of the first word line;
    a pre-programming type indicating that only pre-programming of the pre-programming and post-programming is performed in the memory region;
    a one-shot type indicating that one-shot programming is performed in the memory region;
    a hot-carrier injection (HCI) type indicating that a threshold voltage distribution is changed due to the HCI in the memory region;
    a no-coupled word line (NCW) type indicating that threshold voltage distributions are formed to be generally low as programming is not performed on adjacent word lines in the memory region;
    a sudden power off (SPO) type indicating that programming of the memory region is performed abnormally by the SPO; and
    an erase type indicating that the memory cells of the memory region are not yet programmed.

8. The method as claimed in claim 1, further comprising:
    starting a random interval neighbor check (RINC) operation before outputting the first command; and
    outputting a second command including an OVS read request for the memory region to the non-volatile memory device, based on the started RINC operation, before outputting the first command.

9. The method as claimed in claim 8, wherein the predicted distribution type is one of a retention type, a read disturb type, and an HCI type, and
    wherein the determining of the subsequent operation based on the predicted distribution type includes:
    determining whether the memory region of the non-volatile memory device meets a read reclaim condition; and
    when it is determined that the memory region of the non-volatile memory device meets the read reclaim condition, outputting a third command including a read reclaim request for the memory region to the non-volatile memory device.

10. The method as claimed in claim 1, further comprising:
starting a scan operation before outputting the first command; and
outputting a second command including an OVS read request for the memory region to the non-volatile memory device, based on the started scan operation, before outputting the first command.

11. The method as claimed in claim 10, wherein the predicted distribution type is an SPO type, and
wherein the determining of the subsequent operation based on the predicted distribution type includes:
determining whether the memory region of the non-volatile memory device meets a map-in condition, based on the OVS count data; and
when it is determined that the memory region of the non-volatile memory device meets the map-in condition, outputting a third command including a map-in request for the memory region to the non-volatile memory device.

12. The method as claimed in claim 1, wherein the determining of the distribution type to be the predicted distribution type includes:
inputting the first to fourth count values of the OVS count data to a machine learning function;
generating a plurality of output data by the machine learning function; and
determining a distribution type corresponding to output data having a highest value, from among the plurality of output data, as the predicted distribution type.

13. A method of operating a storage device which includes a non-volatile memory device and a storage controller, the method comprising:
providing, by the storage controller, a first command including an on-chip valley search (OVS) read request for a memory region of the non-volatile memory device to the non-volatile memory device;
generating, by the non-volatile memory device, OVS count data of the memory region based on the first command;
providing, by the storage controller, a second command including a request for the OVS count data to the non-volatile memory device;
providing, by the non-volatile memory device, the OVS count data to the storage controller based on the second command;
determining, by the storage controller, a distribution type of the memory region to be a predicted distribution type, from among a plurality of distribution types, based on the OVS count data; and
determining, by the storage controller, a subsequent operation based on the predicted distribution type.

14. The method as claimed in claim 13, wherein the generating of the OVS count data of the memory region based on the first command by the non-volatile memory device includes:
generating, by the non-volatile memory device, a first count value indicating a number of memory cells corresponding to a low area count of a first read voltage, from among a plurality of memory cells of the memory region;
generating, by the non-volatile memory device, a second count value indicating a number of memory cells corresponding to a high area count of the first read voltage, from among the plurality of memory cells of the memory region;
generating, by the non-volatile memory device, a third count value indicating a number of memory cells corresponding to a low area count of a second read voltage, from among the plurality of memory cells of the memory region; and
generating, by the non-volatile memory device, a fourth count value indicating a number of memory cells corresponding to a high area count of the second read voltage, from among the plurality of memory cells of the memory region,
wherein the OVS count data include the first to fourth count values.

15. The method as claimed in claim 14, wherein the first read voltage and the second read voltage correspond to a same logical page.

16. The method as claimed in claim 13, wherein the providing of the first command including the OVS read request for the memory region of the non-volatile memory device to the non-volatile memory device by the storage controller includes:
starting, by the storage controller, a random interval neighbor check (RINC) operation; and
outputting, by the storage controller, the first command to the non-volatile memory device, based on the started RINC operation,
wherein the determining of the subsequent operation based on the predicted distribution type by the storage controller includes:
determining, by the storage controller, whether the memory region of the non-volatile memory device meets a read reclaim condition; and
when it is determined that the memory region of the non-volatile memory device meets the read reclaim condition, outputting, by the storage controller, a third command including a read reclaim request for the memory region to the non-volatile memory device, and
wherein the predicted distribution type is one of a retention type, a read disturb type, and an HCI type.

17. The method as claimed in claim 13, wherein the providing of the first command including the OVS read request for the memory region of the non-volatile memory device to the non-volatile memory device by the storage controller includes:
starting, by the storage controller, a scan operation; and
outputting, by the storage controller, the first command to the non-volatile memory device, based on the started scan operation,
wherein the determining of the subsequent operation based on the predicted distribution type by the storage controller includes:
determining, by the storage controller, whether the memory region of the non-volatile memory device meets a map-in condition, based on the OVS count data; and
when it is determined that the memory region of the non-volatile memory device meets the map-in condition, outputting, by the storage controller, a third command including a map-in request for the memory region to the non-volatile memory device, and
wherein the predicted distribution type is an SPO type.

18. A storage controller, comprising:
an on-chip valley search (OVS) management module configured to generate an OVS read request for a memory region of a non-volatile memory device;
a command generator configured to generate a first command including the OVS read request of the memory region and a second command including a request for OVS count data, under control of the OVS management module;

a non-volatile memory interface circuit configured to provide the first and second commands to the non-volatile memory device, and to receive the OVS count data from the non-volatile memory device; and a type determiner configured to determine a distribution type of the memory region to be a predicted distribution type, from among a plurality of distribution types, based on the OVS count data.

19. The storage controller as claimed in claim 18, wherein the plurality of distribution types include:

a normal type indicating that memory cells of the memory region are programmed normally;

a retention type indicating that threshold voltages of the memory cells of the memory region decrease over time;

a read disturb type indicating that a threshold voltage distribution of a second word line adjacent to a first word line in the memory region is changed depending on a read operation of the first word line;

a pre-programming type indicating that only pre-programming of the pre-programming and post-programming is performed in the memory region;

a one-shot type indicating that one-shot programming is performed in the memory region;

a hot-carrier injection (HCI) type indicating that a threshold voltage distribution is changed due to the HCI in the memory region;

a no-coupled word line (NCW) type indicating that threshold voltage distributions are formed to be generally low as programming is not performed on adjacent word lines in the memory region;

a sudden power off (SPO) type indicating that programming of the memory region is performed abnormally by the SPO; and an erase type indicating that the memory cells of the memory region are not yet programmed.

20. The storage controller as claimed in claim 18, further comprising:

a machine learning device configured to assist the type determiner to determine the distribution type of the memory region to be the predicted distribution type, from among the plurality of distribution types, wherein the machine learning device is further configured to:

input a low area count value and a high area count value associated with each of a plurality of read voltages of the OVS count data to a machine learning function;

generate a plurality of output data by the machine learning function; and determine a distribution type corresponding to output data having a highest value, from among the plurality of output data, as the predicted distribution type.

* * * * *